United States Patent
Seliger et al.

(10) Patent No.: US 12,495,499 B1
(45) Date of Patent: Dec. 9, 2025

(54) MULTI-FUNCTION LIGHT SWITCH WITH BOARD STACK

(71) Applicant: Arctevity Inc., Woburn, MA (US)

(72) Inventors: Robert Seliger, Beverly, MA (US); Christopher Egan, Concord, NH (US); Alexander William Seiger, Manchester, NH (US)

(73) Assignee: Arctevity Inc., Woburn, MA (US)

( * ) Notice: Subject to any disclaimer, the term of this patent is extended or adjusted under 35 U.S.C. 154(b) by 663 days.

(21) Appl. No.: 17/821,338

(22) Filed: Aug. 22, 2022

Related U.S. Application Data

(60) Provisional application No. 63/275,570, filed on Nov. 4, 2021.

(51) Int. Cl.
*H05K 1/14* (2006.01)
*H02G 3/12* (2006.01)

(52) U.S. Cl.
CPC ............ *H05K 1/144* (2013.01); *H02G 3/121* (2013.01)

(58) Field of Classification Search
CPC ........... H05K 1/14; H05K 1/144; H02G 3/121
See application file for complete search history.

(56) References Cited

U.S. PATENT DOCUMENTS

| | | | | |
|---|---|---|---|---|
| 2018/0188779 | A1* | 7/2018 | Allen | G06F 1/1626 |
| 2019/0221958 | A1* | 7/2019 | Karc | H01R 13/6683 |
| 2021/0329768 | A1* | 10/2021 | Johnson | H02G 3/10 |
| 2022/0352120 | A1* | 11/2022 | Hong | H01L 23/5385 |

OTHER PUBLICATIONS

"Brilliant: Smart Home Automation", https://www.brilliant.tech/home?tab=system, retrieved Jun. 7, 2022.
"Iotty Smart Home", https://iottysmarthome.com/, retrieved Jun. 7, 2022.

* cited by examiner

*Primary Examiner* — Patrick C Chen
(74) *Attorney, Agent, or Firm* — Cesari and McKenna, LLP

(57) ABSTRACT

A multi-function switch for controlling various functions of building systems includes a board stack with a plurality of PCBs configured to reside entirely within an off-the-shelf single gang wall switch box. The external components of the light switch have the appearance of a standard light switch familiar to the user. This reduces device clutter, complexity, user confusion, and expense by consolidating user-controlled building functions into a single device familiar to the user. By using an off-the-shelf switch box, the installation of the multi-function light switch avoids requirements of custom sized wall switch boxes. Given the relatively small dimensions of the switch box, the configuration and design of the board stack is non-trivial. The orientation of each PCB in the board stack, the connections between the PCBs in the stack, and the accommodation of any other components are such that the entirety of these components wholly reside within the switch box.

10 Claims, 23 Drawing Sheets

| (W) MIN | (L) MIN | (R) | (C) | APPLICATION (FACE OF DEVICE) |
|---|---|---|---|---|
| 1.310 | 2.630 | 0.079 | 4.062 | 1.300 MAX W X 2.620 MAX L (347V SWITCH) |
| 1.310 | 2.630 | 0.094 | 3.812 | 1.300 MAX W X 2.620 MAX L |

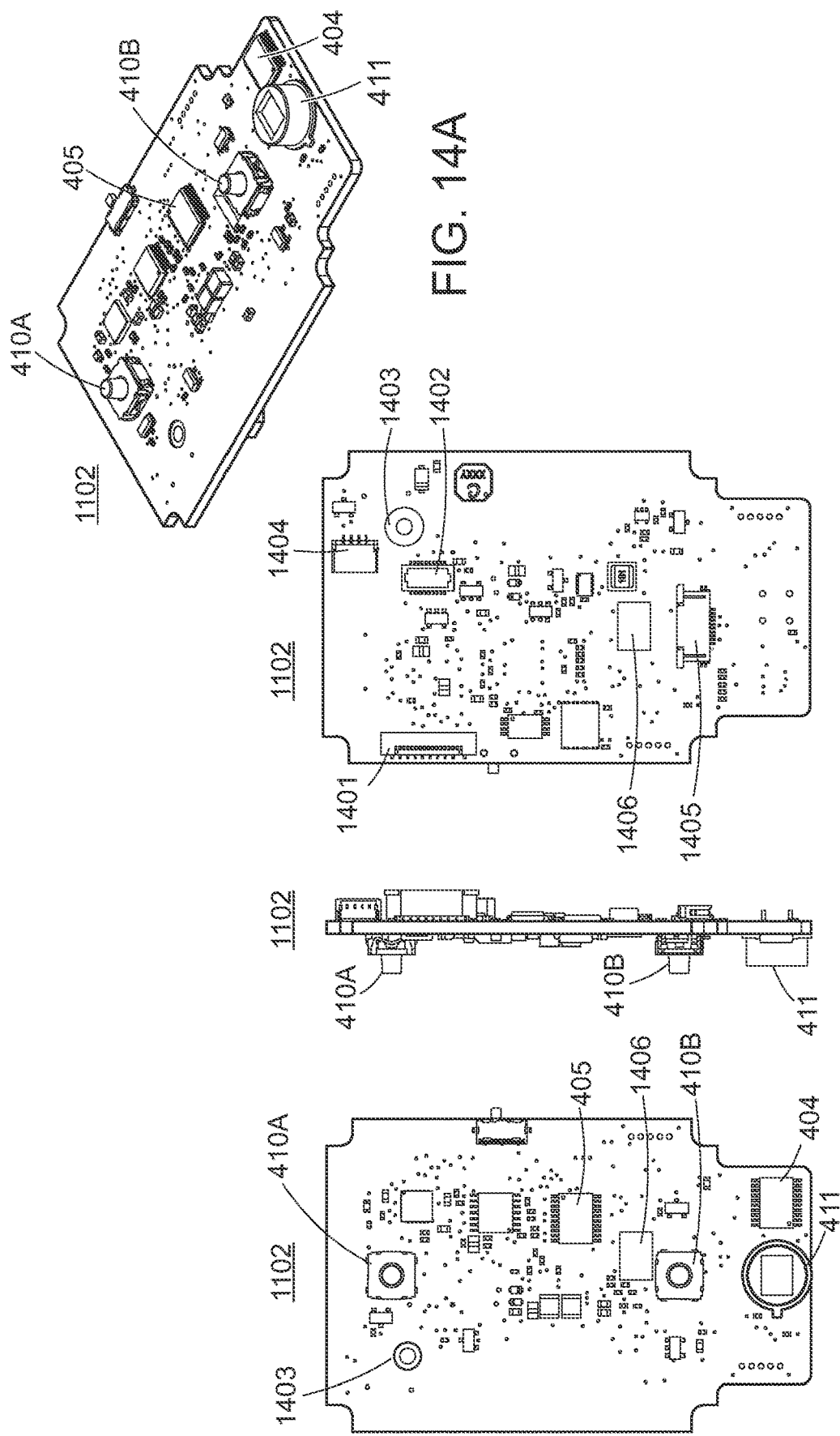

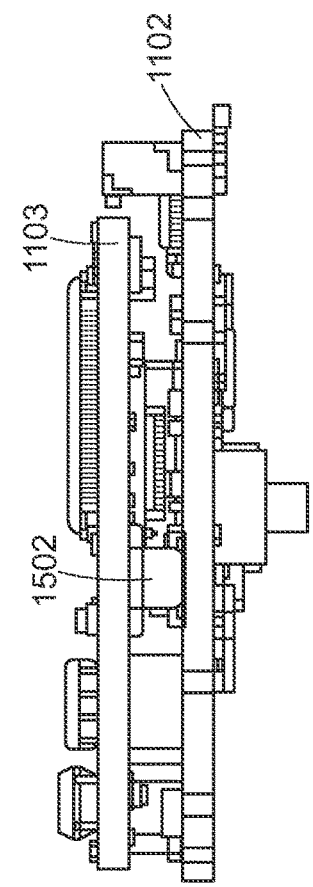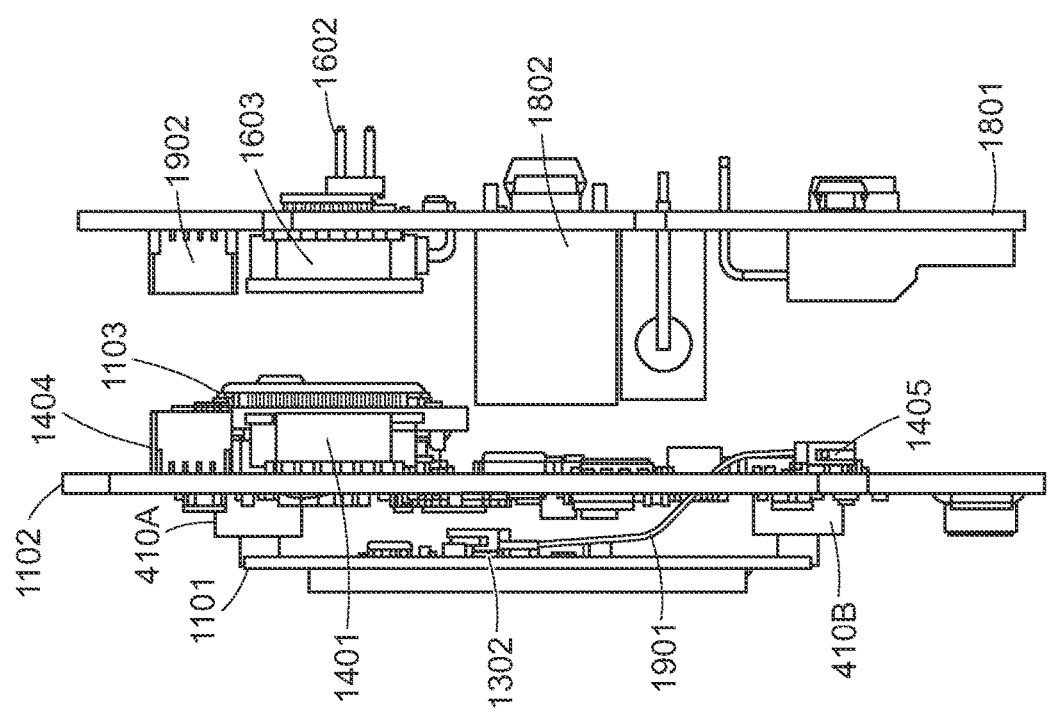

| BUILDING FUNCTION | USER GESTURE | STATE OF BUILDING FUNCTION | AUDIO FEEDBACK | VISUAL FEEDBACK |
|---|---|---|---|---|
| Paddle illumination | Move near light switch | | None | Paddle light turns on white |
| | Move away from light switch | | None | Paddle light turns off |
| Lighting control | Push & release paddle at top | Lights on; sets intensity to last value set | None | Display current lighting level 0-100% scale |
| | Push & release paddle at bottom | Lights off | None | Display current lighting level 0-100% scale |
| | Push & hold paddle at top | Lights increase intensity until the paddle is released | Enunciates "The current lighting level is XXX percent" | Display current lighting level 0-100% scale |
| | Push & hold paddle at bottom | Lights decrease intensity until the paddle is released | Enunciates "The current lighting level is XXX percent" | Display current lighting level 0-100% scale |
| Select temperature control | Push and hold paddle in at top and bottom for several seconds | Set temperature | Enunciates "The current temperature is XXX and the current setting is YYY" | Paddle light turns green; display indicates the current temperature and target |
| Unselect temperature control | Once in set-temperature-mode, do not interact with the light switch for several seconds | | | Paddle light turns white, indicating that the switch is once again functioning as a light switch |
| Set target temperature | Push & hold the paddle at top | Target temperature increases until paddle released | Enunciates the current temperature value at every degree | Paddle light remains green; display indicates the current temperature and new target |
| | Push & hold the paddle at bottom | Target temperature decreases until paddle released | Enunciates the current temperature value at every degree | Paddle light remains green; display indicates the current temperature and new target |

FIG. 25

MULTI-FUNCTION LIGHT SWITCH WITH BOARD STACK

CROSS-REFERENCE TO RELATED APPLICATIONS

This patent application claims priority to co-pending U.S. Provisional Patent Application Ser. No. 63/275,570, titled "Autonomous Buildings", filed on Nov. 4, 2021.

BACKGROUND OF THE INVENTION

The wall-mounted light switch is well known in buildings. In recent years, a variety of devices and software applications have been introduced that attempt to increase the ease by which people control the functioning of various building systems, such as lighting, heating and/or cooling, and security systems. However, some of the user interfaces for these devices and applications are typically proprietary and fail to conform to any standard. The user interfaces may also be unfamiliar to the user and overly complicated to use to control building systems. The challenges of these user interfaces cause frustration for the user and/or may be a barrier to adoption. Offering control of building functions using the user interface of a well-known wall-mounted light switch faces the challenge of configuring the necessary hardware to fit wholly within the standard and/or off-the-shelf switch form factor.

BRIEF SUMMARY OF THE INVENTION

Disclosed herein is a device with a standard light switch form factor, where the device provides a user interface for controlling a plurality of building systems. Embodiments of the present invention are given in the dependent claims. Embodiments of the present invention can be freely combined with each other if they are not mutually exclusive.

According to one embodiment of the present invention, a switch assembly includes a multi-function switch for controlling various functions of building systems includes a board stack with a plurality of printed circuit boards (PCBs) configured to reside entirely within an off-the-shelf single gang wall switch box. The external components of the light switch have the appearance of a standard light switch familiar to the user. This reduces device clutter, complexity, user confusion, and expense by consolidating user-controlled building functions into a single device familiar to the user. By using an off-the-shelf wall switch box, the installation of the multi-function light switch avoids requirements of custom sized wall switch boxes. Given the relatively small dimensions of the wall switch box, the configuration and design of the board stack is non-trivial. The orientation of each PCB in the board stack, the connections between the PCBs in the stack, and the accommodation of any other components are such that the entirety of these components wholly reside within the wall switch box.

BRIEF DESCRIPTION OF THE SEVERAL VIEWS OF THE FIGURES

FIGS. 14A-14D illustrate a front perspective view, a front view, a side view, and a rear view, respectively, of an exemplary embodiment of the function PCB.

FIGS. 19A and 19B illustrate a side view and a top view, respectively, of an exemplary embodiment of the connections between the PCBs of the board stack with a dimmer PCB.

FIG. 25 illustrates a table of example associations between the building functions, the user gesture, and the state of the building function.

DETAILED DESCRIPTION OF THE INVENTION

Figure 1:
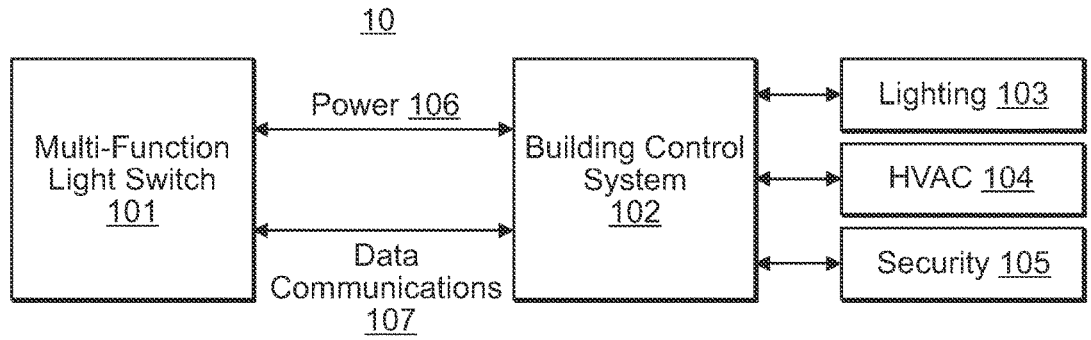
FIGS. 1-3 illustrate some embodiments of systems comprising the multi-function light switch.

The following description is presented to enable one of ordinary skill in the art to make and use the present invention and is provided in the context of a patent application and its requirements. Various modifications to the embodiment will be readily apparent to those skilled in the art and the generic principles herein may be applied to other embodiments. Thus, the present invention is not intended to be limited to the embodiment shown but is to be accorded the widest scope consistent with the principles and features described herein.

Reference in this specification to "one embodiment," "an embodiment," "an exemplary embodiment," or "a preferred embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments. In general, features described in one embodiment might be suitable for use in other embodiments as would be apparent to those skilled in the art.

Embodiments of the present invention comprises a multi-function light switch with a standard light switch form factor. The external components of the light switch have the appearance of a standard light switch. For example, the external components may include or be coupled to a standard U.S. "Decora" style light switch face plate with a rectangular opening. In some embodiments, the external components comprise a "paddle," known to be used with a standard light switch and which may be pushed in at a first location (e.g., top of paddle) and/or a second location (e.g., bottom of paddle). The paddle is further capable of displaying audio and/or visual cues to convey different information to the user. The user interacts with the external components to control various functions of systems in a building. In some embodiments, the gestures of the user interactions with the paddle are used to identify the associated actions, which can then be executed. By having external components with the appearance and function of a standard light switch, the user interface of the light switch is familiar to the user, improving the usability of the building control system. Internal components of the multi-function light switch include a board stack comprising a plurality of printed circuit boards (PCB). The PCB of the board stack are configured to wholly reside within an off-the-shelf wall switch wall switch box. Embodiments of the present invention are described further below with reference to the figures.

FIGS. 1-21 use the following reference numerals:
- 10 First embodiment of a system comprising the multi-function light switch
- 20 Second embodiment of a system comprising the multi-function light switch
- 30 Third embodiment of a system comprising the multi-function light switch
- 101 multi-function light switch
- 102 external building control system
- 103 lighting
- 104 HVAC
- 105 security functions
- 106 power
- 107 data communications link
- 401 converter
- 402 linear converter
- 403 primary microcontroller unit (MCU)
- 404 passive infrared (PIR) MCU
- 405 audio/visual (AV) MCU
- 406 Flash memory
- 407 anti-aliasing filter
- 408 audio amplifier
- 409 light emitting diodes (LEDs)
- 410A first button
- 410B second button
- 411 PIR sensor(s)
- 412 display
- 413 speaker(s)
- 414 cable
- 415 cable
- 416 audio circuit
- 500 light switch assembly
- 501 standard one-gang mounting yoke
- 502 front enclosure
- 503 paddle
- 504 board stack
- 507 PIR lens
- 508 paddle hinge
- 509 wall switch box mounting holes
- 510 wall plate mounting holes
- 511 board stack mounting holes on yoke 501
- 601 board stack enclosure
- 602 IO module cover
- 603 board stack and yoke mounting holes on enclosure 601
- 604 add-on module mounting holes
- 901 wall plate
- 902 mounting screws
- 903 wall switch box
- 904 opening in wall plate
- 1101 paddle printed circuit board (PCB)
- 1102 function PCB
- 1103 MCU PCB
- 1104 IO or expansion PCB
- 1301 ribbon cable
- 1302 connector to connect paddle PCB 1101 to function PCB 1102
- 1303 coupling holes to couple paddle PCB 1101 and function PCB 1102
- 1304 connections on paddle PCB 1101
- 1305 bottom edge of the paddle PCB 1101
- 1401 first connector on function PCB 1102
- 1402 second connector on function PCB 1102
- 1403 through hole on function PCB 1102
- 1404 third connector on function PCB 1102
- 1405 fourth connector on function PCB 1102
- 1406 opening in function PCB 1102
- 1501 RS485 transceiver
- 1502 connector on MCU PCB 1103
- 1503 through hole in MCU PCB 1103
- 1601 connector on IO PCB 1104
- 1602 pin header on IO PCB 1104
- 1603 function pass through connector on IO PCB 1104
- 1701 cavity within wall switch box 903
- 1801 dimmer PCB
- 1802 components of dimmer PCB 1801
- 1803 wires
- 1901 flexible printed circuit (FPC) cable
- 1902 connector on dimmer PCB 1801
- 2001 two-gang mounting yoke
- 2010 first portion of mounting yoke 2001
- 2020 second portion of mounting yoke 2001
- 2002 second user interface
- 2004 wall switch box mounting holes on second portion 2020
- 2005 two-gang wall plate mounting holes on second portion 2020
- 2006 rear enclosure
- 2007 yoke mounting holes on enclosure 2008
- 2008 second enclosure
- 2101 two-gang wall plate
- 2102 two-gang wall switch box
- 2103 second opening in two-gang wall plate 2101

2104 two-gang wall plate mounting screws

Figure 2:
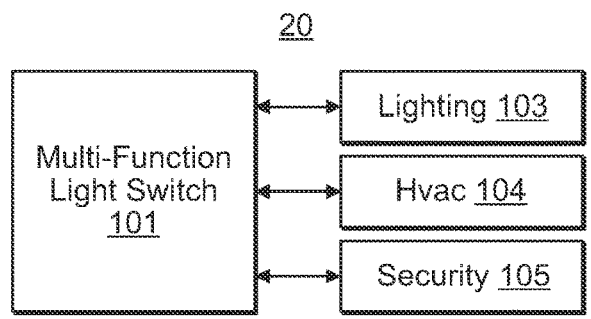
Figure 3:
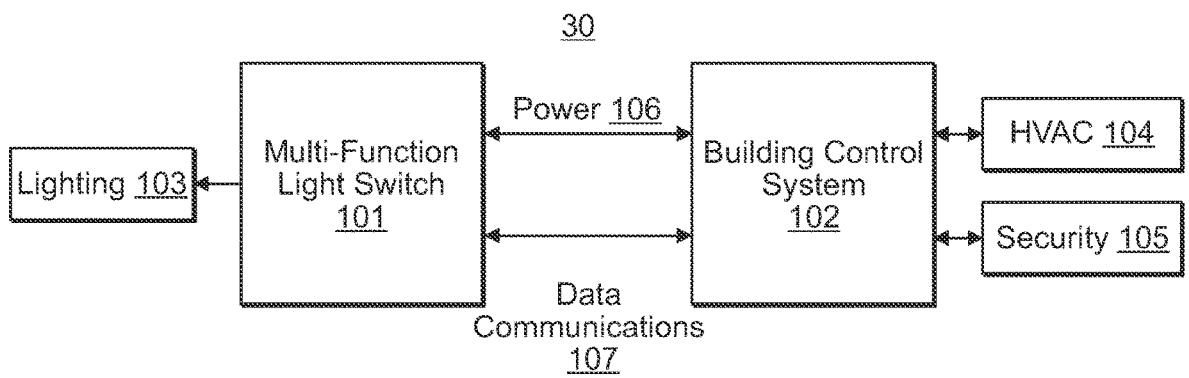

FIGS. 1-3 illustrate some embodiments of systems comprising the multi-function light switch. In the system 10 of FIG. 1, the multi-function light switch 101 serves as a user interface device, with building functions being controlled by an external building control system 102. In the system 20 of FIG. 2, the multi-function light switch 101 serves as a user interface device and is configured with capabilities for direct control of building functions without the assistance of an external building control system. In the system 30 of FIG. 3, the multi-function light switch 101 serves as a user interface device and is configured with capabilities for direct control of some building functions, with an external building control system 102 controlling the remainder of the building functions.

In each of the systems 10, 20, 30 illustrated in FIGS. 1-3, the multi-function light switch 101 requires power 106 for its operations. The power 106 may be provided by a local battery, by extraction and conversion from a 120 VAC source. or by conveyance over a cable from a remote power source, e.g., Power Over Ethernet. In systems 10 and 30, the multi-function light switch 101 is coupled to an external building control system 102 via a data communications link 107. The data communications link 107 may be of any type, including but not limited to a Local Area Network (LAN) connection, a serial connection, or wireless (e.g., WiFi, Bluetooth, etc.). The communications protocol between the switch 101 and the building control system 102 may be of any type, including but not limited to a proprietary message structure over a standard substrate (e.g., HTTP, RS485, etc.), or an existing full-stack protocol may be used (e.g., BACNet, ModBus, etc.) Building functions controlled by the systems 10, 20, 30 may include, but are not limited to, lighting 103, HVAC 104 (Heating, Ventilation, and Air Conditioning), and security 105 functions.

Figure 4:
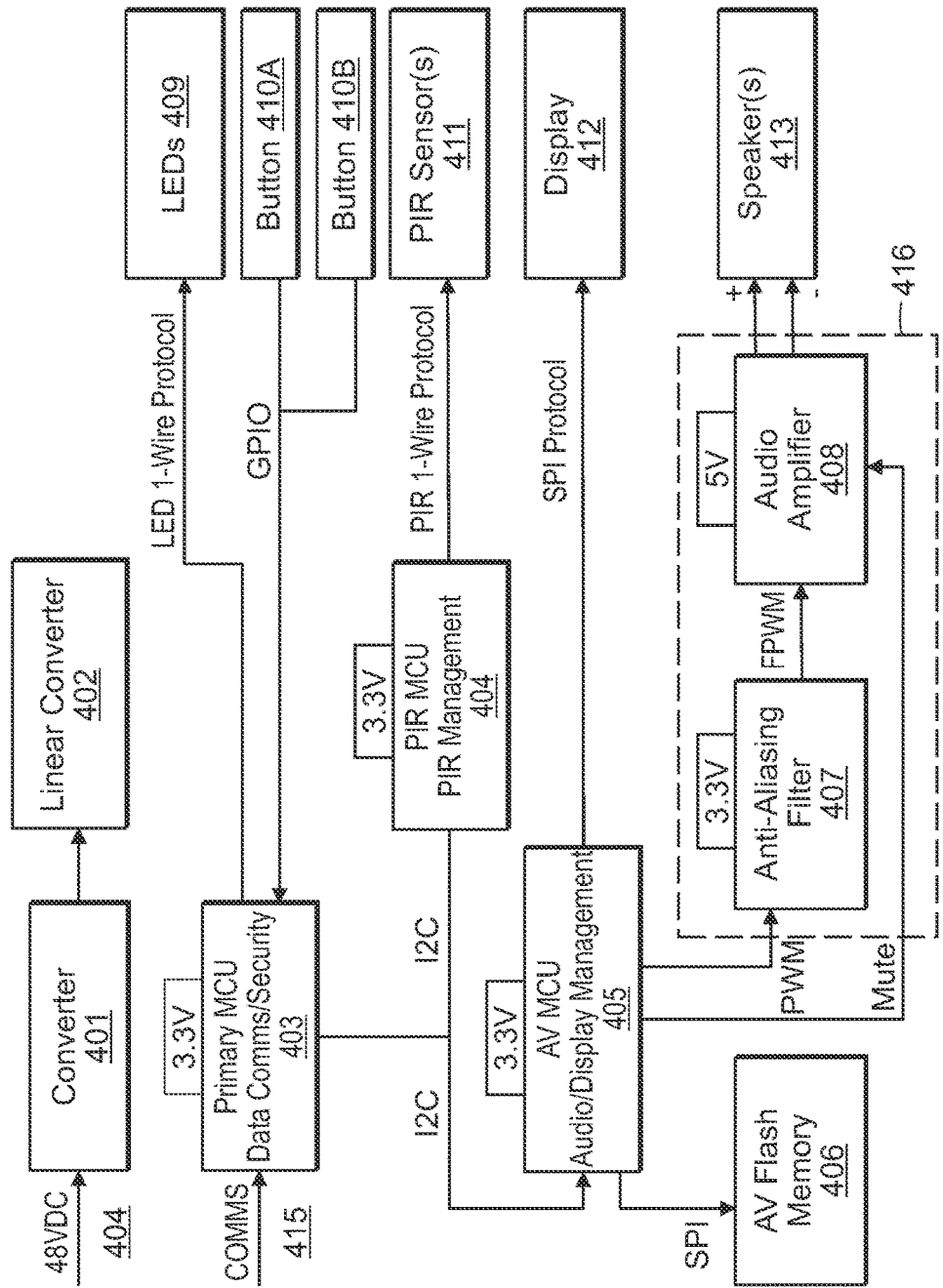
FIG. 4 illustrates an exemplary embodiment of components of the multi-function light switch.

FIG. 4 illustrates an exemplary the components of the multi-function light switch 101. In some embodiments, the switch 101 does not include or utilize all of the components illustrated. In the exemplary embodiment, the switch 101 is provided VDC (Volts of Direct Current) power, e.g., 48 VDC, via a cable 414. The 48 VDC power is converted to 5 VDC by the converter 401 via a switching DC-to-DC power supply (not shown). The 5V is needed to power the LEDs (Light Emitting Diodes) 409 and the audio amplifier 416. The 5 VDC is stepped down to 3.3 VDC by a linear converter 402. The 3.3V is needed to power a variety of electronic components of the switch 101. External RS485 data communications is provided by a cable 415. In one embodiment, the data communications is provided via different conductors in the cable 415 that provides the power. Commands transmitted from the building control system 102 (see FIGS. 1-3) are digitally signed and encrypted. Similarly, responses from the switch 101 are digitally signed and encrypted.

The primary microcontroller unit (MCU) 403 is configured with firmware and software to control the various functionalities of the switch 101. In the illustrated exemplary embodiment, the primary MCU 403 is configured to communicate with the LEDs 409 (e.g., 4X Bezel addressable Red-Green-Blue LED) using an LED 1-wire protocol. In the exemplary embodiment, the primary MCU 403 controls the on/off state, the brightness, and the color of the LEDs 409. The primary MCU 403 is further configured to communicate with a plurality of buttons 410A-410B using a general purpose input/output (GPIO) protocol. The buttons 410A-410B are positioned to engage a component, such as a paddle, on an exterior portion of a light switch assembly comprising the switch 101. The light switch assembly is described further below with referenced to FIGS. 9-13. In the exemplary embodiment, the switch 101 comprises two buttons, with a first button 410A positioned to engage a first location of the paddle, and a second button 410B positioned to engage a second location of the paddle. When the paddle is pressed at the first location, the first button 410A is engaged. When the paddle is pressed at the second location, the second button is engaged. When the paddle is pressed at both the first and second locations, both the first and second buttons 410A-410B are engaged. When the first button is engaged, a first pull-up resistor is connected to ground. When the second button is engaged, a second pull-up resistor is connected to ground. The primary MCU 403 samples the state of the buttons 410A-410B, each of which are open by default. Although the exemplary embodiment is described with a paddle, other types of components may be used on the exterior of the light switch assembly to engage the buttons 410A-410B. Although the switch 101 is illustrated with two buttons, any number of buttons can be used.

The passive infrared (PIR) MCU 404 is configured with firmware and/or software to control the functionalities of one or more PIR sensors 411. The PIR MCU 403 is configured to communicate with the PIR sensors 411 using a sensor specific, PIR 1-wire protocol. The PIR MCU 403 analyzes the sensor data received or collected from the PIR sensors 411 to determine whether a person is in the vicinity of the switch 101.

The Audio/Visual (AV) MCU 405 is configured with firmware and/or software for controlling the functionalities of the audio circuit 416 comprising an anti-aliasing filter 407 and an audio amplifier 408 (e.g., Class D Audio Amplifier). The AV MCU 405 can cause audio sounds from the audio circuit 416 to be output via one or more speakers 413 (e.g., mini speaker). In the exemplary embodiment, the AV MCU 405 communicates with the audio circuit 416 by generating 8-bit 16 MHz Pulse Width Modulation (PWM) audio signals. Sampling artifacts are filtered out of the PWM stream by the anti-aliasing filter 407. The filtered PWM signal serves as the input to the audio amplifier 408. The amplified analog output from the audio amplifier 408 serves as the drive signal for the speakers 413. In the exemplary embodiment, to prevent popping and clicking noises during power-up, for example, the AC MCU 405 can mute the amplifier's 408 audio output using the amplifier's mute control signal.

The AV MCU 405 is further configured with firmware and/or software for controlling a display 412 (e.g., LED display) and can cause visual elements, such as an image or text, to be output on the display 412. In the exemplary embodiment, the AV MCU 405 communicates with the display 412 using a display-specific Serial Peripheral Interface (SPI)-based protocol. In some embodiments, the AV MCU 405 uses an off-chip Flash memory 406 to store audio and visual files. The AV MCU 405 communicates with the memory 406 via a chip-specific SPI-based protocol.

The primary MCU 403 further serves as the secure communications interface between the switch 101 and any external devices or systems, including the building control system 102. The primary MCU 403 serves as an Inter-Integrated Circuit (I2C) controller and relays commands received from the building control system 102 to the PIR MCU 404 and AV MCU 405, each of which functions as I2C responders. The PIR MCU 404 and AV MCU 405 are configured with firmware and/or software to receive the I2C messages and act upon the I2C messages.

Although the exemplary embodiment of FIG. 4 is illustrated with specific values, protocols, and components, other suitable values, protocols, and components may be used to implement the functions of the switch 101 without departing from the spirit and scope of the present invention.

Figure 5:
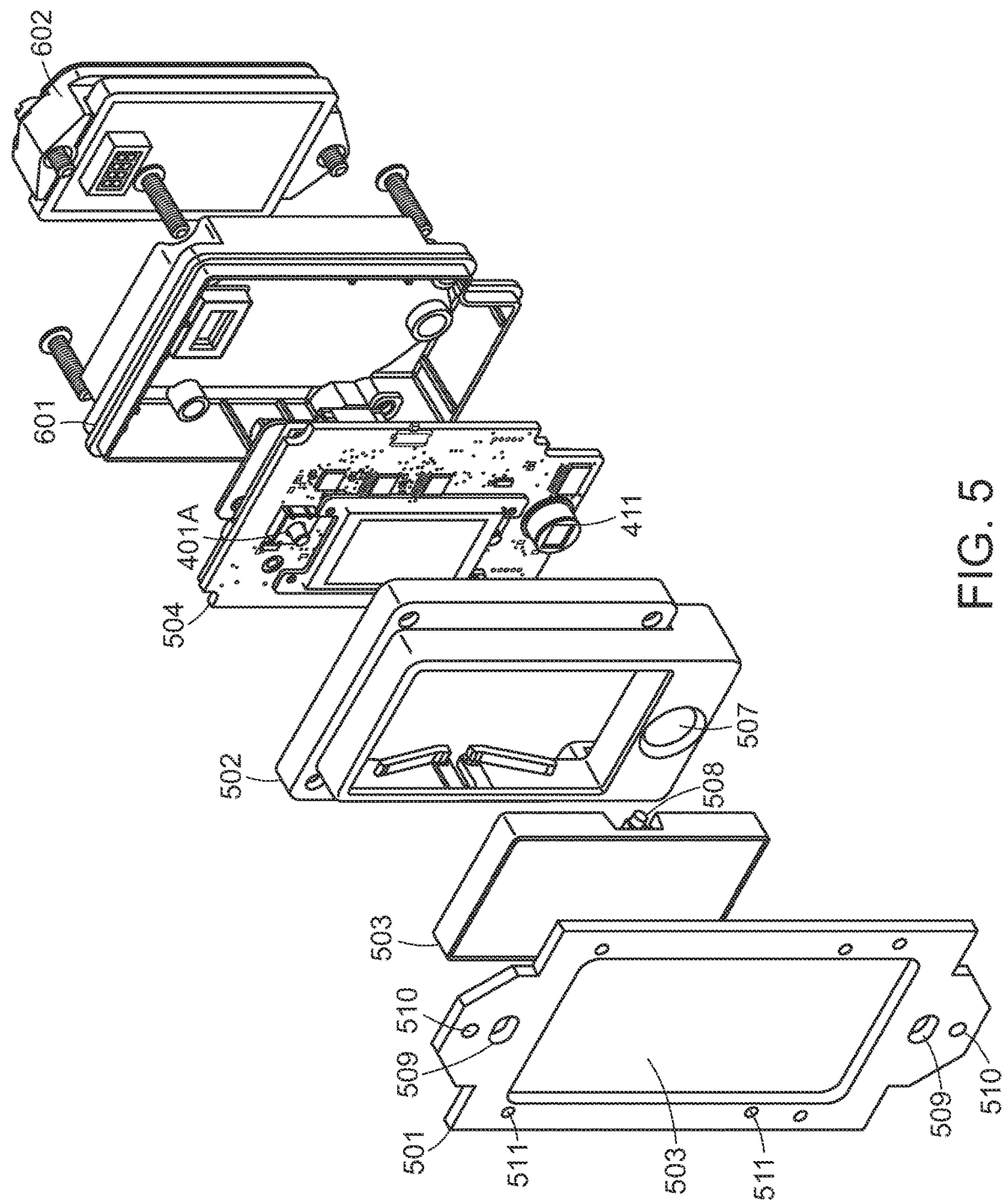
FIG. 5 illustrates an exploded view of the light switch assembly.
Figure 6A:
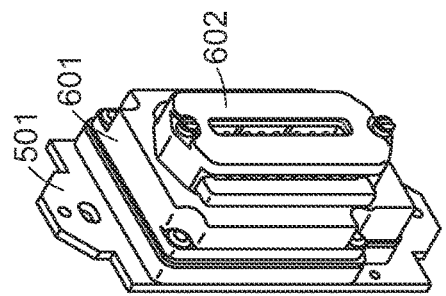
FIGS. 6A through 6F illustrates a front perspective view, a back perspective view, front view, side view, rear view, and a top view, respectively, of the light switch assembly.
Figure 6B:
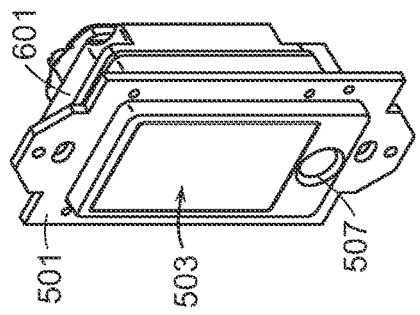
Figure 6C:
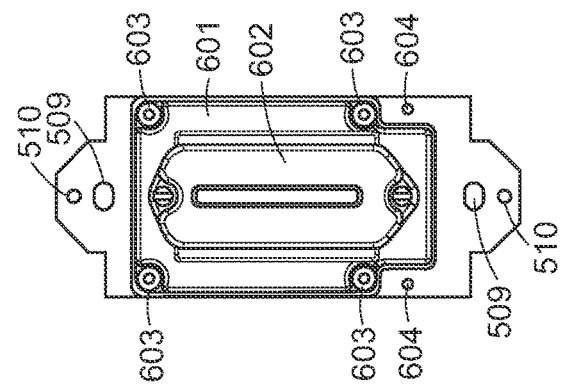
Figure 6D:
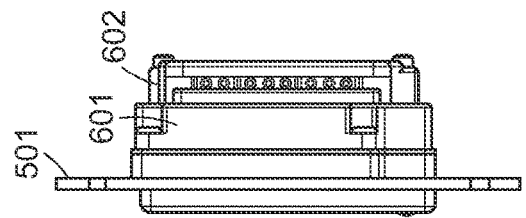
Figure 6F:
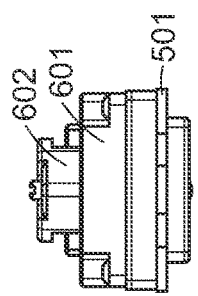
Figure 6E:
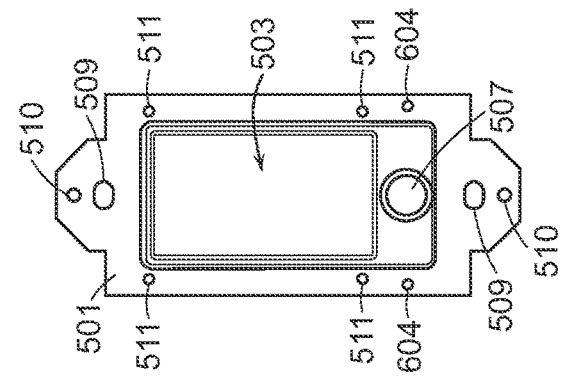
Figure 7:
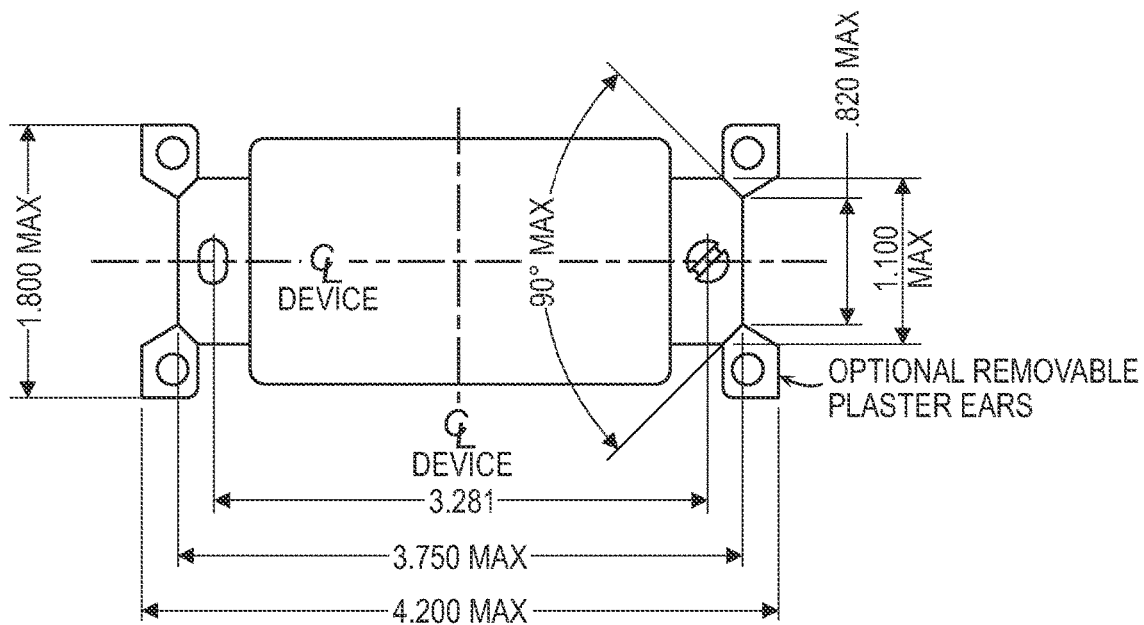
FIGS. 7 and 8 illustrate an excerpt of the dimensions of a single gang mounting yoke according to "ANSI/NEMA WD 6-2016: Wiring Devices-Dimensional Specifications" ("the Standard").
Figure 8:
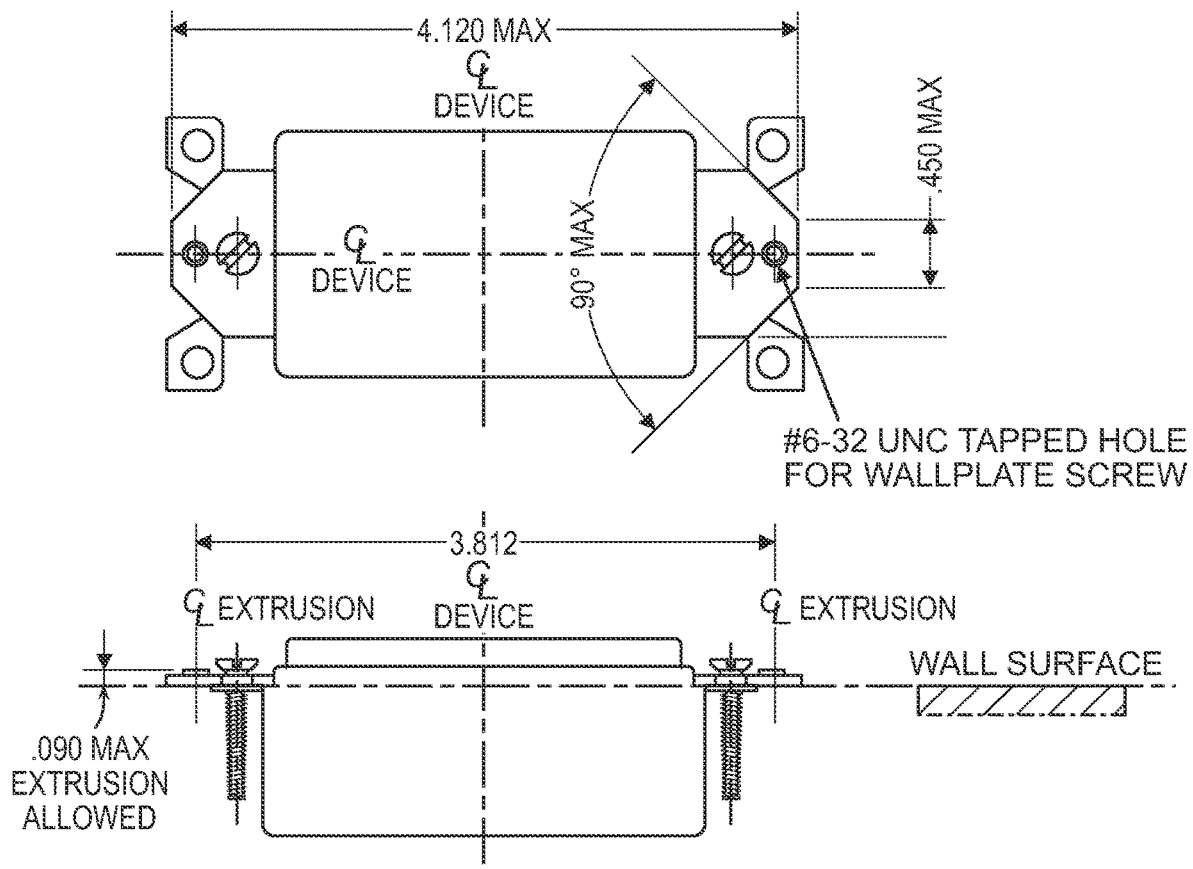

FIG. 5 illustrates an exploded view of the light switch assembly 500. FIGS. 6A through 6F illustrates a front isometric view, a back isometric view, front view, side view, rear view, and a top view, respectively, of the light switch assembly 500. The light switch assembly 500 includes a standard mounting yoke 501, a front enclosure 502, a paddle 503, a board stack 504, a board stack enclosure 601, and an Input/Output (IO) module cover 602 with a plurality of IO modules within (not visible). The standard mounting yoke 501 enables the light switch assembly 500 to be mounted in an off-the-shelf single gang wall switch wall switch box (see FIGS. 9A and 9C and description below), and it enables any standard U.S. "Decora" style light switch face plate to be mounted to the light switch assembly 500. As used herein, the standard mounting yoke 501 has the physical dimensions according to the "ANSI/NEMA WD 6-2016: Wiring Devices-Dimensional Specifications" ("Standard"), approved by the American National Standard (ANSI) and published by the National Electrical Manufacturers Association, an excerpt of which is attached as an Appendix and incorporated herein by reference. An excerpt of the Standard pertaining to the dimensions of the mounting yoke 501 is illustrated in FIGS. 7 and 8. When installed, the mounting yoke 501 is mounted to the wall switch or gang box by a coupling mechanism traversing through the mounting holes 509. The board stack 504 is coupled to the mounting yoke 501 via a coupling mechanism traversing the holes 511 and wholly resides within the wall switch box. The board stack 504 is described further below. The mounting yoke 501 includes an opening through which a user interface, such as the paddle 503, is accessible to a user. The mounting yoke 501 includes holes 510 through which mounting screws traverse to couple a wall plate (not shown). A PIR lens 507 resides at the bottom of the front enclosure 502. The location of the PIR lens 507 corresponds to the PIR sensor 411. The PIR sensor 411 is mounted on the board stack 504 and does not move with the paddle 503. The paddle 503 includes a hinge 508 which enables the paddle 503 to "rock" when pressed in at the top or bottom. In an exemplary embodiment, the paddle 503 can also be simultaneously pressed in at the top and bottom, enabling the pressing of two buttons at the same time to be interpreted as a gesture that is distinct from pressing any one button, and can be equipped with a spring (not shown) for facilitating a return action. The IO modules serve as the connection points to externally sourced DC voltage and a daisy chained RS485 data communication link with the building control system 102.

Referring specifically to FIGS. 6A through 6F, the board stack 504 wholly resides within an enclosure 601. The enclosure 601 is coupled to the mounting yoke 501 via one or more attachment mechanisms (e.g., screws) traversing holes 511 in the mounting yoke 501 and holes 603 in the enclosure 601. Coupled to the rear of the enclosure 601 is an input/output (IO) module cover 602. The mounting yoke 501 further includes holes 604 for coupling any add-on modules (e.g., heat sinks).

Figure 9A:
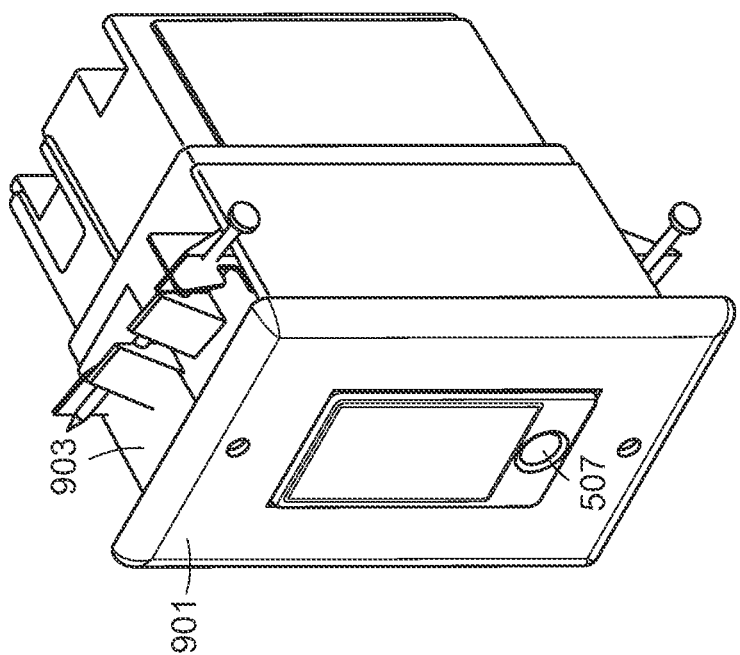
FIGS. 9A-9C illustrate a front perspective view, a front view, and a side view, respectively, of an off-the-shelf single wall switch box.
Figure 9C:
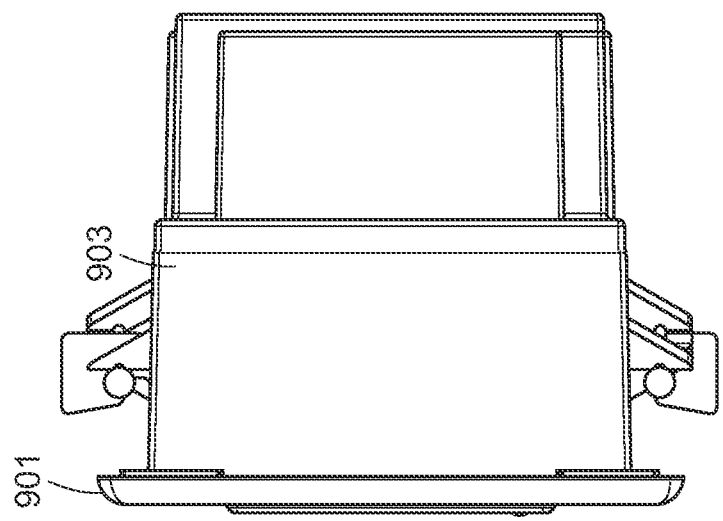
Figure 9B:
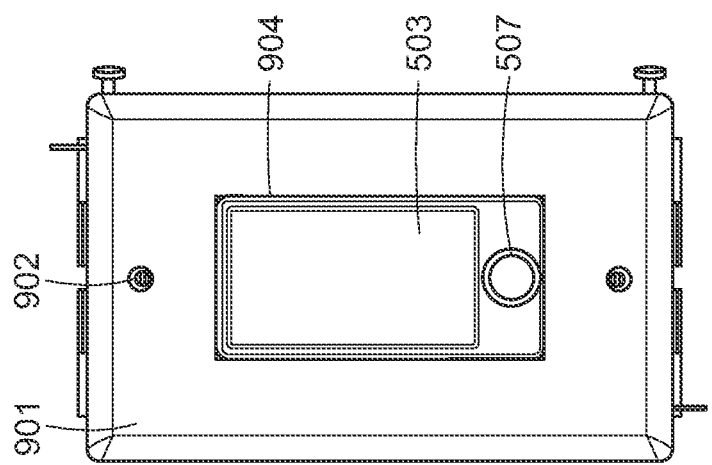
Figure 10:
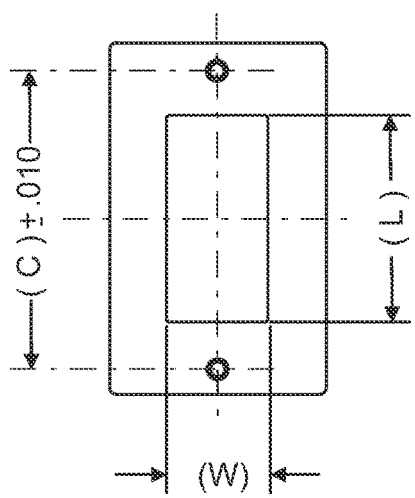
FIG. 10 illustrates an excerpt of the dimensions of a wall plate according to the Standard.

FIGS. 9A-9C illustrate a front isometric view, a front view, and a side view, respectively, of an off-the-shelf single wall switch box. Illustrated is an example off-the-shelf wall switch box of the "single gang" type. Typically, such a wall switch box has approximate dimensions of 2 inches in length, 3 inches in width, and 1.5 to 3.5 inches in depth. Coupled to the front of the wall switch box 903 is a wall plate 901. The wall plate 901 has dimensions according to the Standard, an excerpt of which is illustrated in FIG. 10. The wall plate 901 typically resides on the outside surface of the wall and is visible to the user. The wall plate 901 includes an opening 904 through which a user interface is accessible to a user. The location of the opening 904 corresponds to the location of the opening in the mounting yoke 501. The wall plate 901 is coupled to the mounting yoke 501 (see FIG. 5) through mounting screws 902. The board stack 504 is configured to wholly reside within the wall switch box 903.

By fitting the entirety of the board stack 504 within an off-the-shelf wall switch box and having exterior components familiar to users, such as a paddle, the switch 101 reduces device clutter, complexity, user confusion, and expense by consolidating user-controlled building functions into a single device familiar to the user. By using an off-the-shelf wall switch box 903, the installation of the multi-function light switch 101 avoids requirements of custom sized wall switch boxes. Given the relatively small dimensions of the wall switch box 903, the configuration and design of the board stack 504 is non-trivial. The orientation of each PCB in the board stack 504, the connections between the PCBs in the stack 504, and the accommodation of any other components (e.g., speaker module or dimmer module), must be such that the entirety of these components reside within the wall switch box 903.

Figure 11:
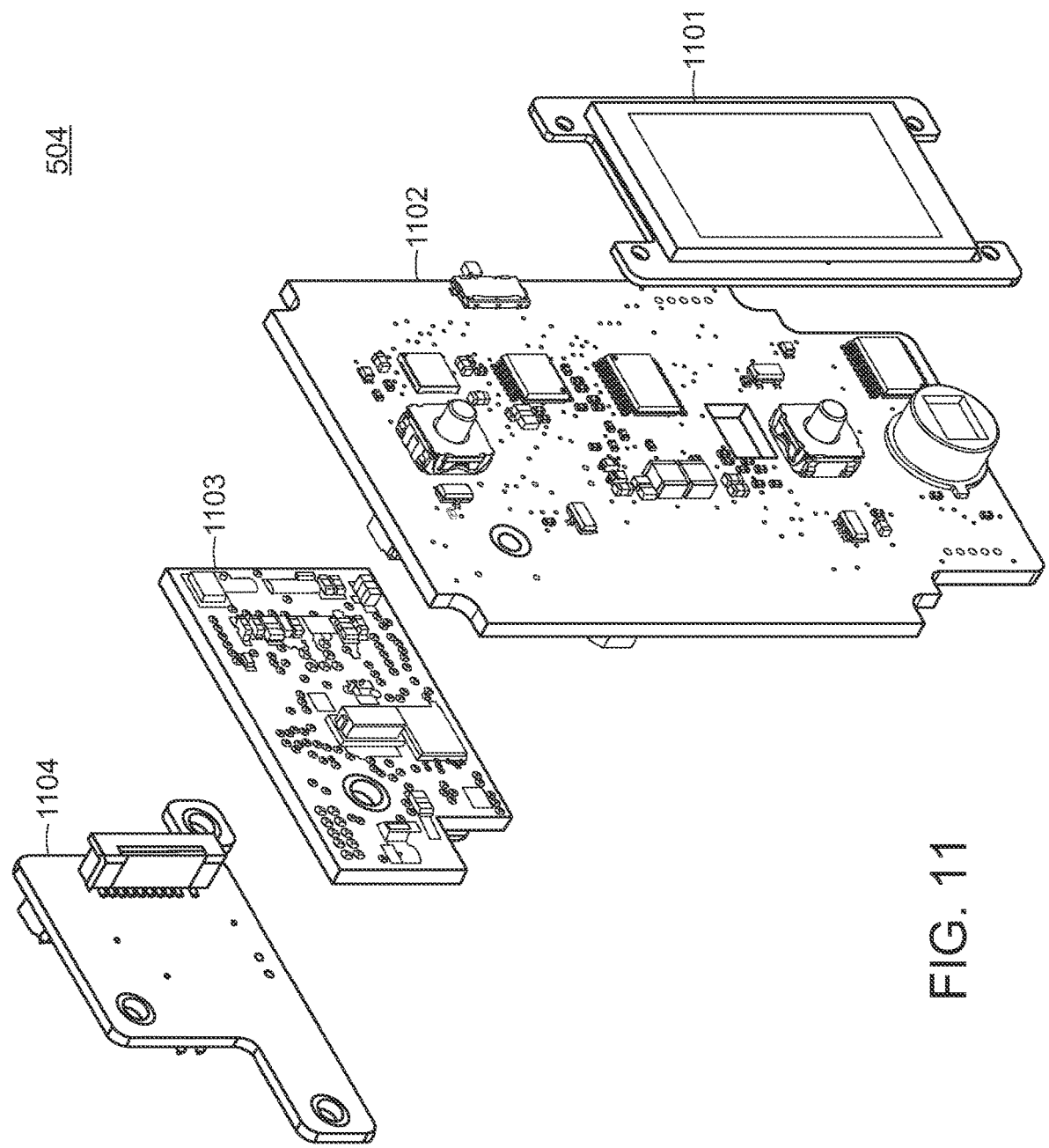
FIG. 11 illustrates an exploded view of an exemplary embodiment of the board stack.
Figure 12A:
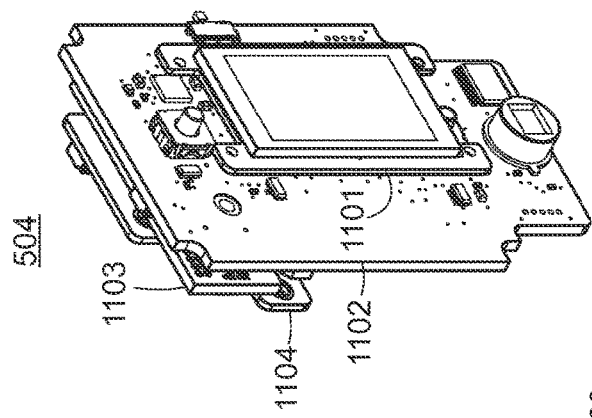
FIGS. 12A-12D illustrate a front perspective view, a front view, a side view, and a rear view, respectively, of the board stack.
Figure 12D:
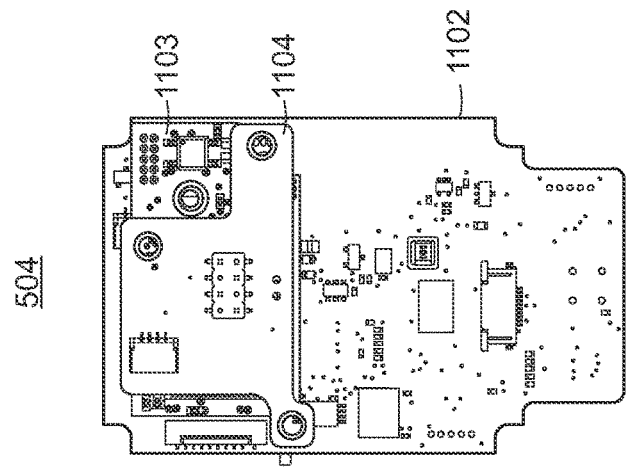
Figure 12C:
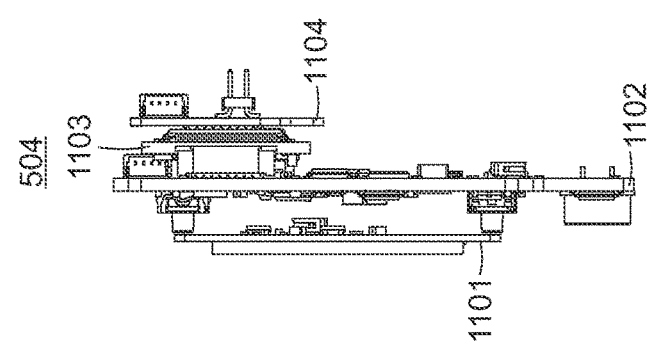
Figure 12B:
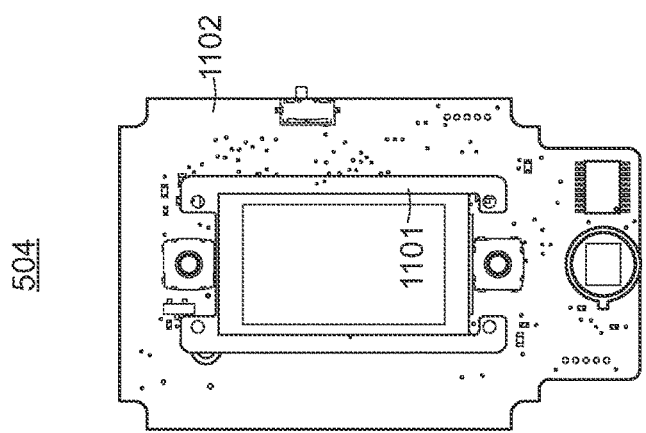
Figure 13B:
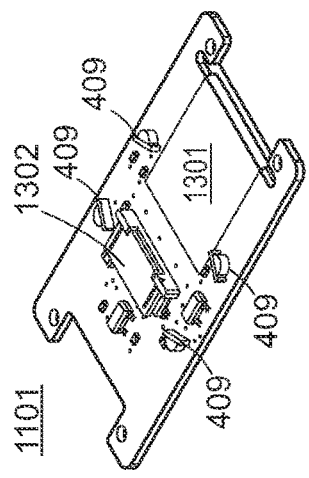
FIGS. 13A-13E illustrate a front perspective view, a back perspective view, a front view, a side view, and a rear view, respectively, of an exemplary embodiment of the paddle PCB.
Figure 13C:
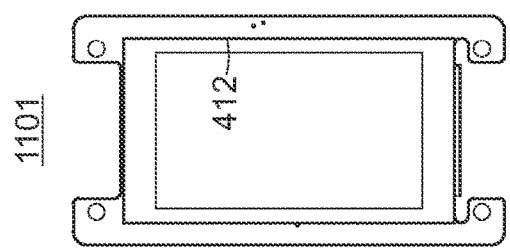
Figure 13D:
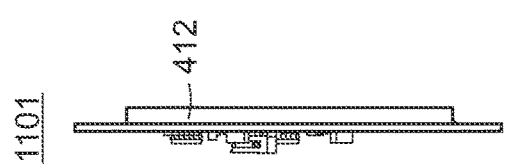
Figure 13A:
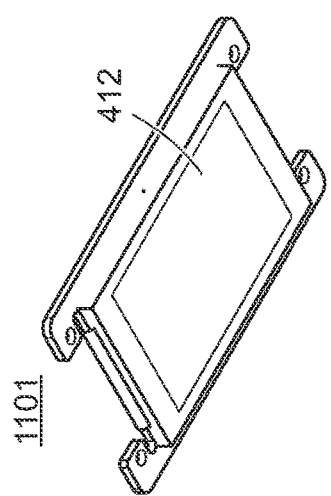
Figure 13E:
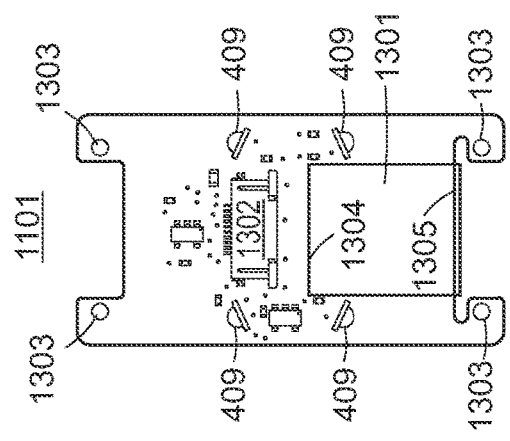
Figure 15A:
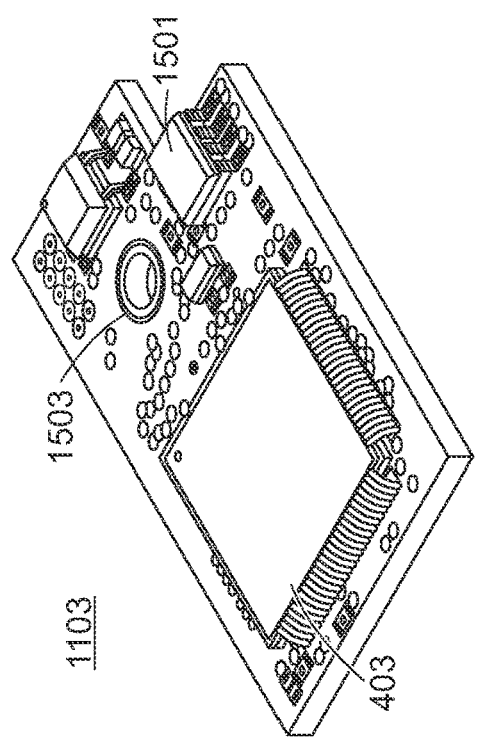
FIGS. 15A-15D illustrate a front perspective view, a front view, a side view, and a rear view, respectively, of an exemplary embodiment of the MCU PCB.
Figure 15B:
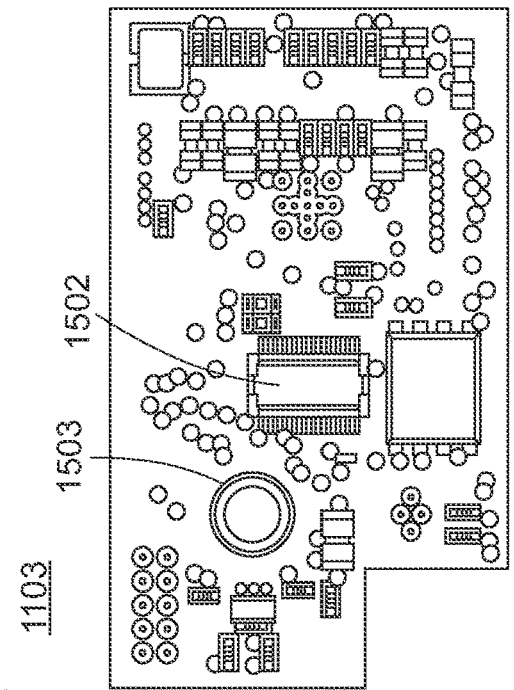
Figure 15C:
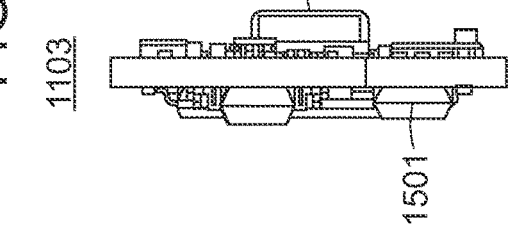
Figure 15D:
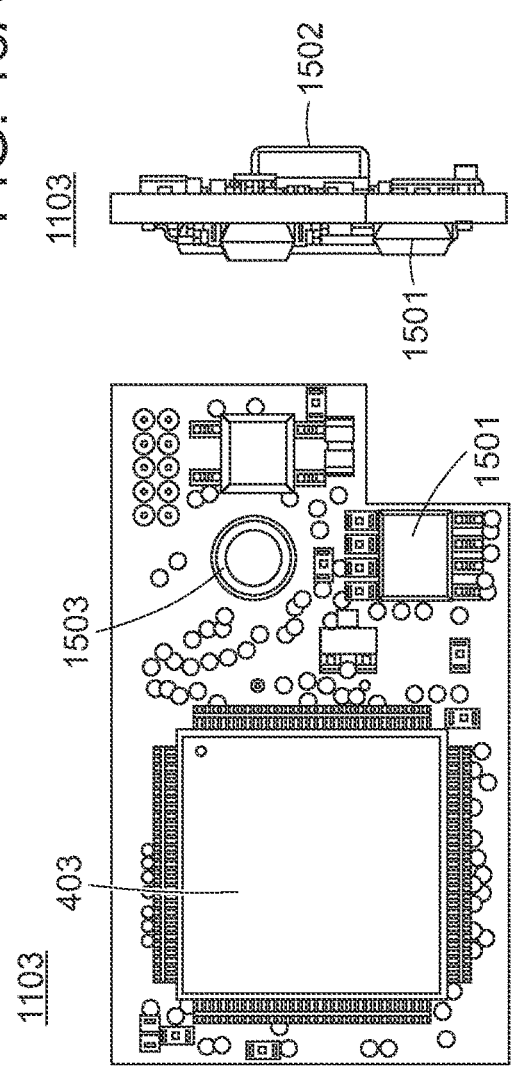
Figure 16A:
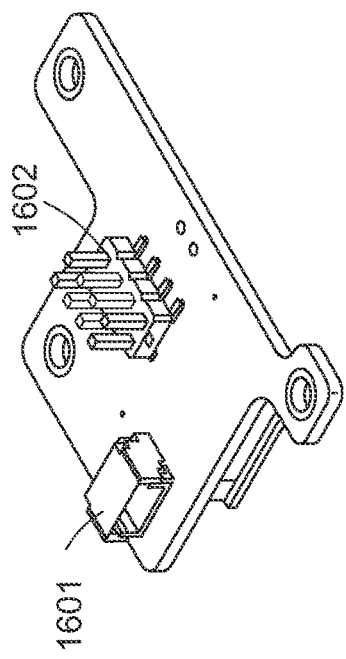
FIGS. 16A-16D illustrate a back perspective view, a front view, a side view, and a rear view, respectively, of an exemplary embodiment of the IO or expansion PCB.
Figure 16B:
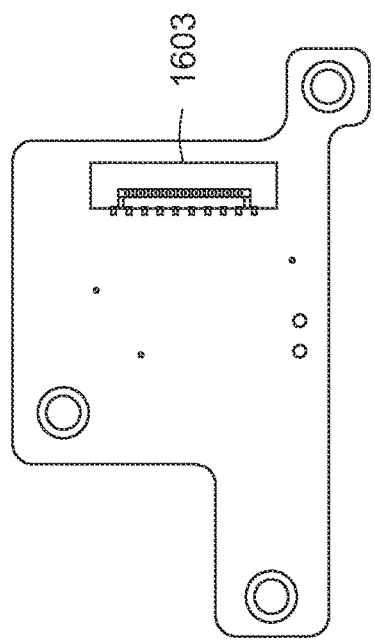
Figure 16C:
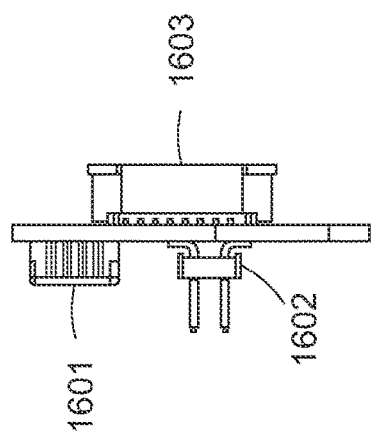
Figure 16D:
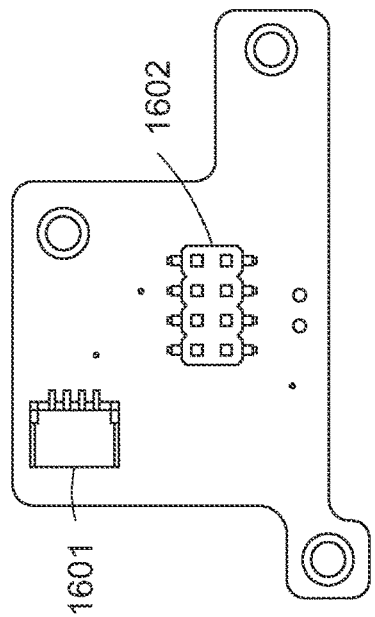

FIG. 11 illustrates an exploded view of an exemplary embodiment of the board stack 504. FIGS. 12A-12D illustrate a front isometric view, a front view, a side view, and a rear view, respectively, of the board stack 504. In this exemplary embodiments, the board stack 504 includes at least four PCBs: a user interface PCB, a function PCB 1102, a microcontroller (MCU) PCB 1103, and an input-output (IO) or expansion PCB 1104. In this exemplary embodiment, the user interface comprises a paddle 503, and the user interface PCB comprises a paddle PCB 1101. The paddle PCB 1101 communicates with the user interface and the function board 1102. The function board 1102 communicates with each of the other PCBs in the board stack 504 and is the main board in the board stack 504. The MCU PCB 1103 includes the primary MCU 403 and controls or manages the overall functions of the switch 101 and communicates with the other components of the switch 101 via the function board 1102. The IO PCB 1104 functions as a pass through component for the exchanging of signals and data between the PCBs in the board stack 504 and components or systems external to the switch 101. In one exemplary embodiment and referring again to FIG. 4, the PIR MCU 404, the AV MCU 405, the buttons 410A-410B, and the PIR sensor 411 reside on the function PCB 1102. The primary MCU 403 resides on the MCU PCB 1103, and the LEDs 409 and display 412 reside on the paddle PCB 1101. Each PCB is described further below.

FIGS. 13A-13E illustrate a front isometric view, a back isometric view, a front view, a side view, and a rear view, respectively, of an exemplary embodiment of the paddle PCB 1101. The paddle PCB 1101 includes a front side (see FIG. 13C) and a rear side opposite the front side (see FIG. 13E). The display 412 is coupled to the front side of the paddle PCB 1101 via a ribbon cable 1301. One end of the ribbon cable 1301 (not shown) attaches to the display 412. The ribbon cable 1301 traverses around the bottom edge 1305 of the paddle PCB 1101 and along part of the rear side of the paddle PCB 1101 (see FIG. 13E). The opposite end of the ribbon cable 1301 is soldered to connections residing on the rear side of the paddle PCB 1101. The paddle PCB 1101 includes a connector 1302 for a cable (not shown) to electrically connect the paddle PCB 1101 to the function PCB 1102, as described further below. The paddle PCB 1101 further includes the LED's 409 and holes 1303 for physically coupling the paddle PCB 1101 and the function PCB 1102.

FIGS. 14A-14D illustrate a front isometric view, a front view, a side view, and a rear view, respectively, of an exemplary embodiment of the function PCB 1102. The function PCB 1102 includes a front side (see FIG. 14B) and a rear side opposite the front side (see FIG. 14D). The front side of the function PCB 1102 is coupled to the rear side of the paddle PCB 1101. The front side of the function PCB 1102 includes the buttons 410A-410B and the PIR sensor 411. The first button 410A is located on the function PCB 1102 such that it is engaged when the paddle 503 is pressed in at the top. The second button 410B is located on the function PCB 1102 such that it is engaged when the paddle 503 is pressed in at the bottom. Both buttons 410A-410B are simultaneously engaged when the paddle 503 is simultaneously pressed in at both the top and bottom. The PIR sensor 411 is located on the function PCB 1102 at a location corresponding to the PIR lens 507 (see FIG. 5). Also on the front side is the PIR MCU 404 and the AV MCU 405. On the rear side, the function PCB 1102 includes a first connector 1401 for a cable (not shown) to electrically connect the function PCB 1102 to the IO PCB 1104, as described further below. This electrical connection allows for signal passing between the function PCB 1102 and IO 1104 PCB, including signals for any components for additional functionality, such a speaker module and/or a dimmer PCB. Also on the rear side of the function PCB 1102 is a second connector 1402 for a cable (not shown) to electrically and physically connect the function PCB 1102 and the MCU PCB 1103, described further below. Further on the rear side is a third connector 1404 for a cable to electrically connect the function PCB 1102 to the IO PCB 1104, and a fourth connector 1405 for a flexible printed circuit (FPC) cable (not shown), which couples to the connector 1302 on the paddle PCB 1101 (see FIG. 13E), to electrically couple the function PCB 1102 to the paddle PCB 1101. In this embodiment, the FPC cable traverses between the rear side of the paddle PCB 1101 and the rear side of the function PCB 1102 via an opening 1406. Optionally, the function PCB 1102 includes a through hole 1403 to allow an attachment mechanism, such as a screw, to firmly physically couple the function PCB 1102 to the MCU PCB 1103, as described further below.

FIGS. 15A-15D illustrate a front isometric view, a front view, a side view, and a rear view, respectively, of an exemplary embodiment of the MCU PCB 1103. The MCU PCB 1103 includes a front side (see FIG. 15B) and a rear side (see FIG. 15D) opposite the front side. The front side of the MCU PCB 1103 is coupled to the rear side of the function PCB 1102 via an electrical and direct physical coupling of the connector 1502 on the MCU PCB 1103 and the connector 1402 on the function PCB 1102. In this embodiment, the MCU PCB 1103 is smaller in size than the function board 1102 and resides proximate to an upper portion of the function board 1102. The MCU PCB 1103 controls the components of the switch 101 via the connections with the function PCB 102 and communicates with components or systems external to the switch 101 via the IO PCB 1101. The MCU PCB 1103 includes the primary MCU 403 and an RS485 transceiver 1501 for the exchange of data through the IO module. Optionally, the MCU PCB 1103 includes a through hole 1503. The location of the through hole 1503 corresponds to the location of the through hole 1403 on the function PCB 1102. An attachment mechanism, such as a screw, traverses both holes 1403 and 1503 to firmly physically couple the MCU PCB 1103 to the function PCB 1102.

FIGS. 16A-16D illustrate a back isometric view, a front view, a side view, and a rear view, respectively, of an exemplary embodiment of the IO or expansion PCB 1104. The IO PCB 1104 includes a front side (see FIG. 16B) and a rear side (see FIG. 16D) opposite the front side. The front side of the IO PCB 1104 is coupled to the rear side of the function PCB 1102 (FIG. 14D) via a coupling of a function pass through connector 1603 on the IO PCB 1104 and the connector 1401 on the function PCB 1102. A connector 1601 at the rear side is for a cable (not shown) to electrically couple to the connector 1404 on the function PCB 1102. A pin header 1602 couples to a header on the IO module to bring power and data in and out of the board stack 504. The IO PCB 1104 is smaller in size than the function PCB 1102 and positioned proximate to the upper portion of the function PCB 1102 and proximate to the MCU PCB 1103.

Figure 17:
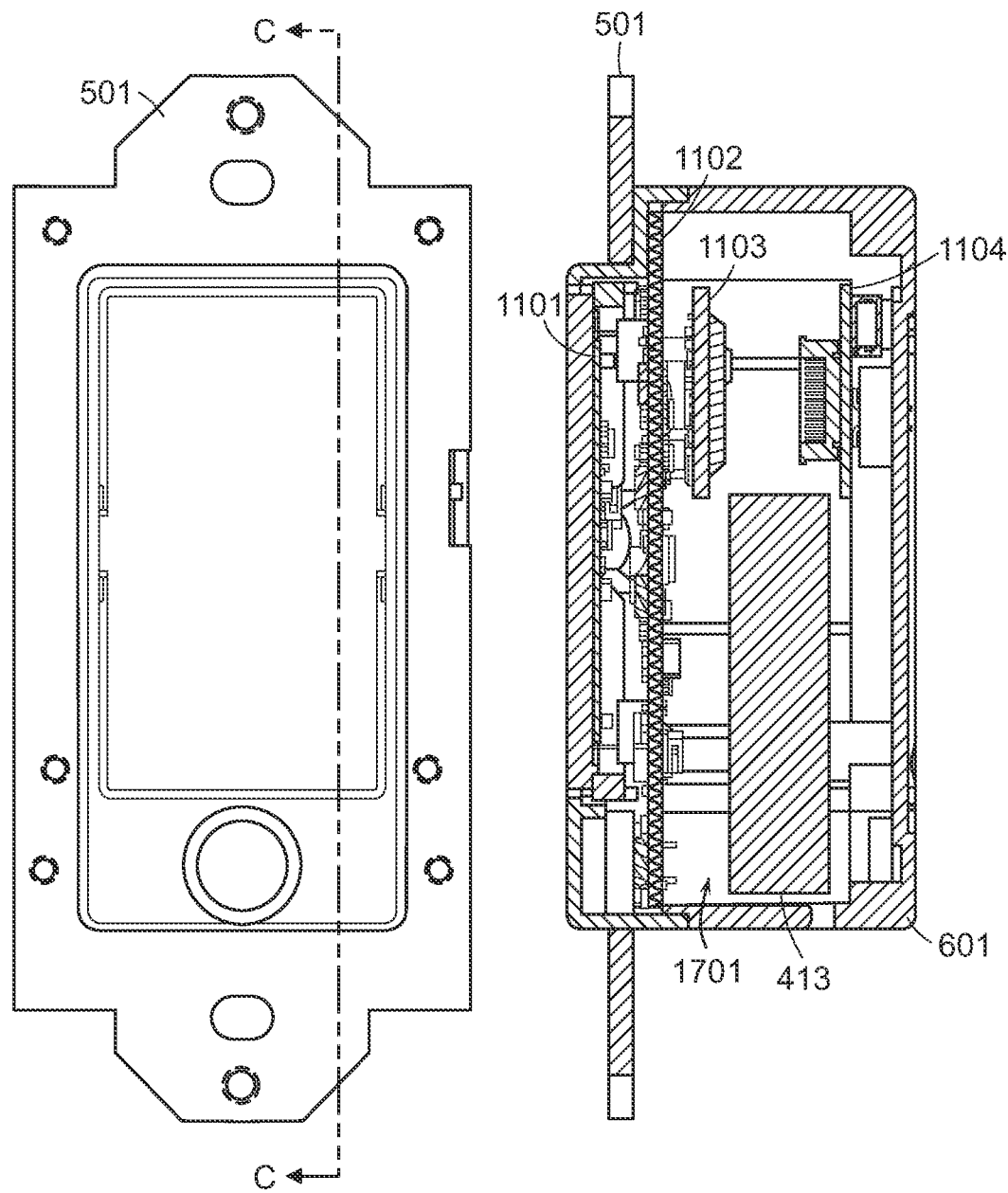
FIGS. 17 and 18 illustrate cross-sectional views of exemplary embodiments of the board stack that wholly reside within a single gang wall switch box.
Figure 18:
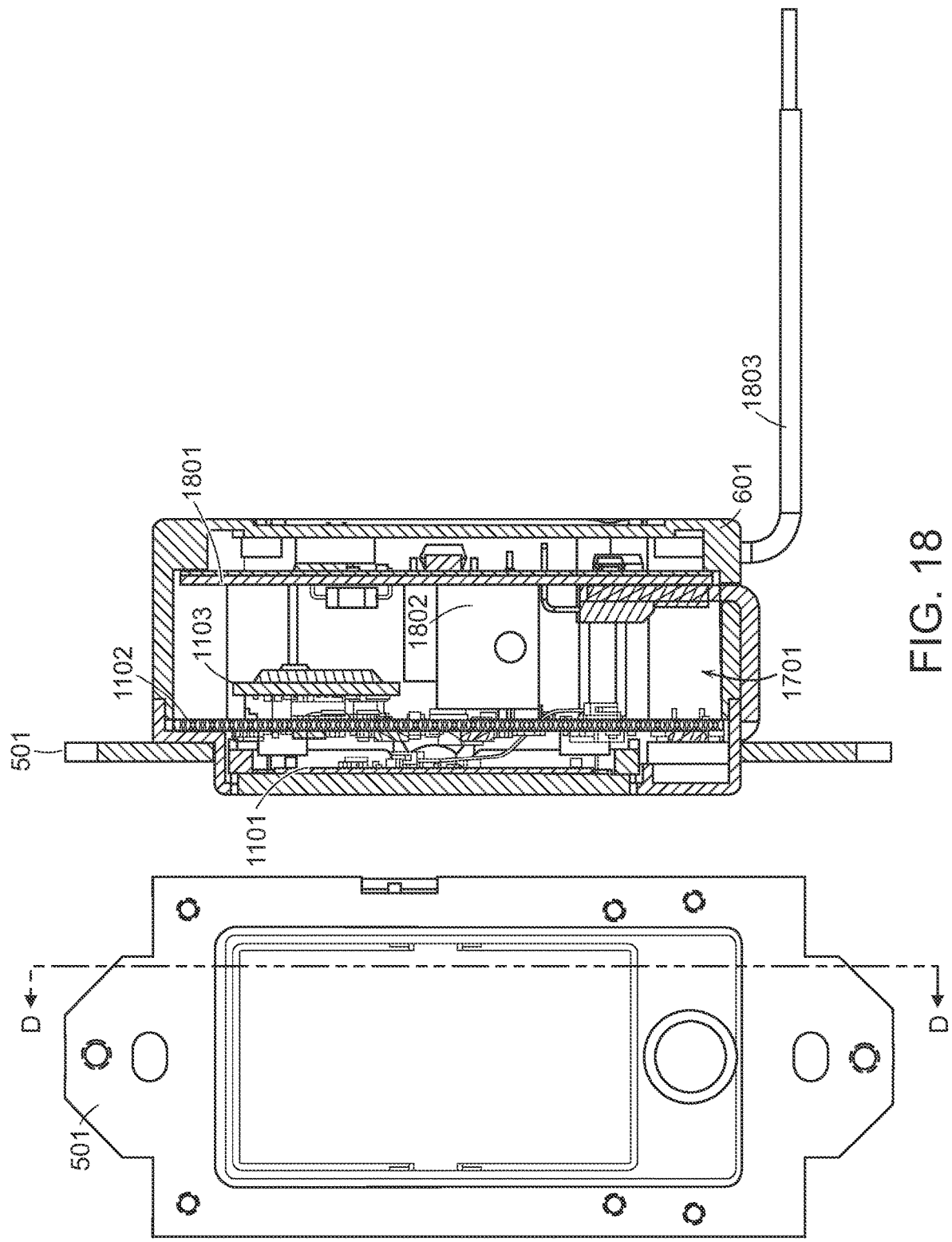
Figure 20A:
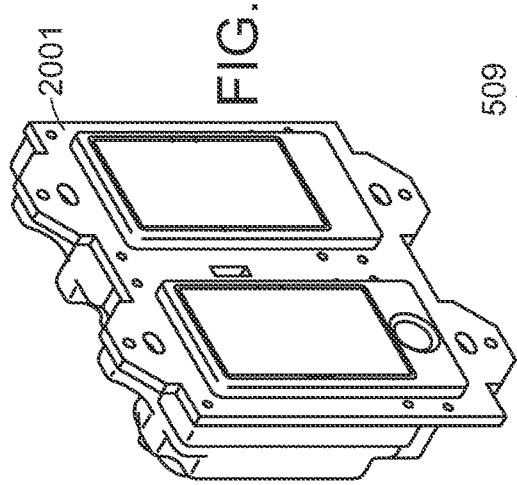
FIGS. 20A-20D illustrate a front perspective view, a front view, a side view, and a rear view, respectively, of the switch with a two-gang mounting yoke.
Figure 20D:
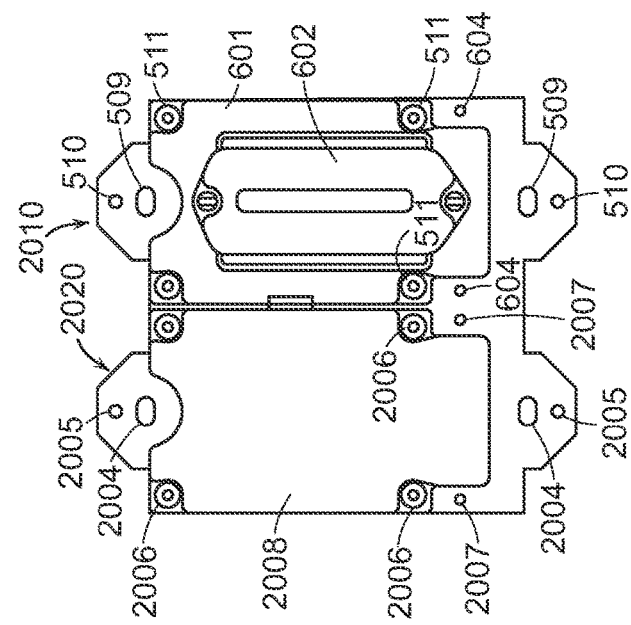
Figure 20C:
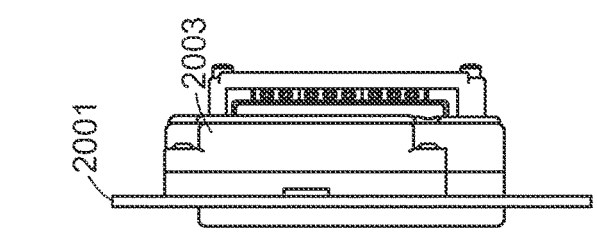
Figure 20B:
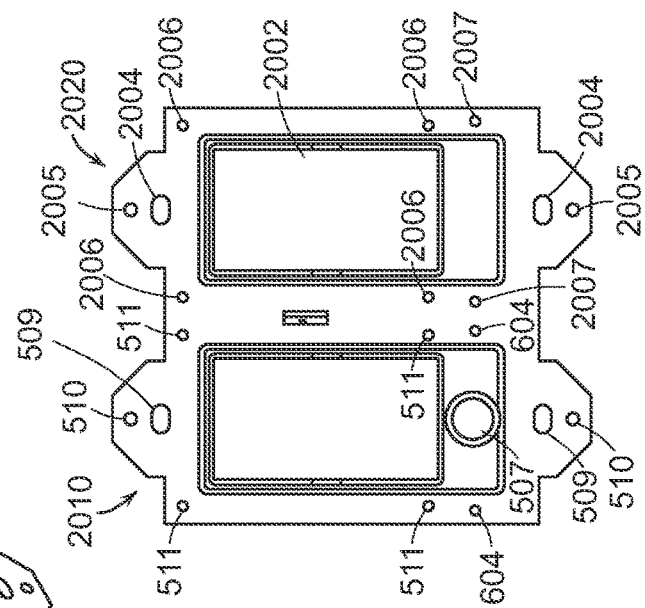
Figure 21D:
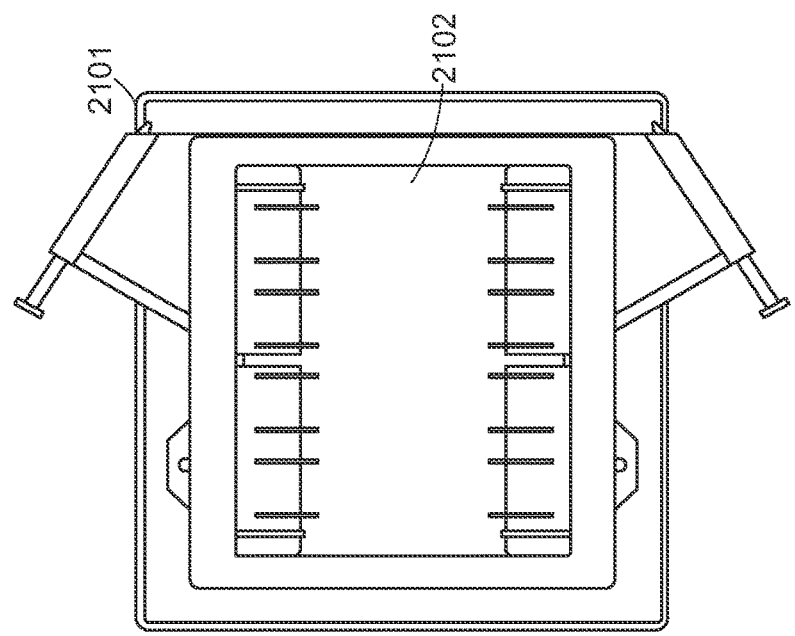
FIGS. 21A-21D illustrate a front perspective view, a front view, a side view, and a rear view, respectively, of a two-gang wall switch box with a standard two-gang wall plate.
Figure 21C:
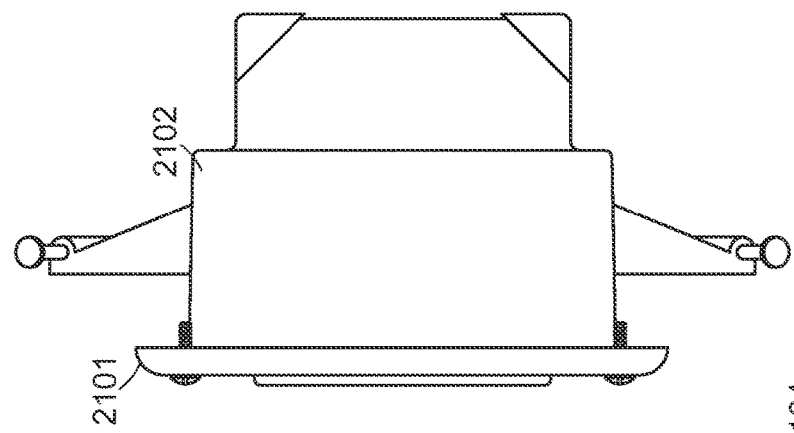
Figure 21B:
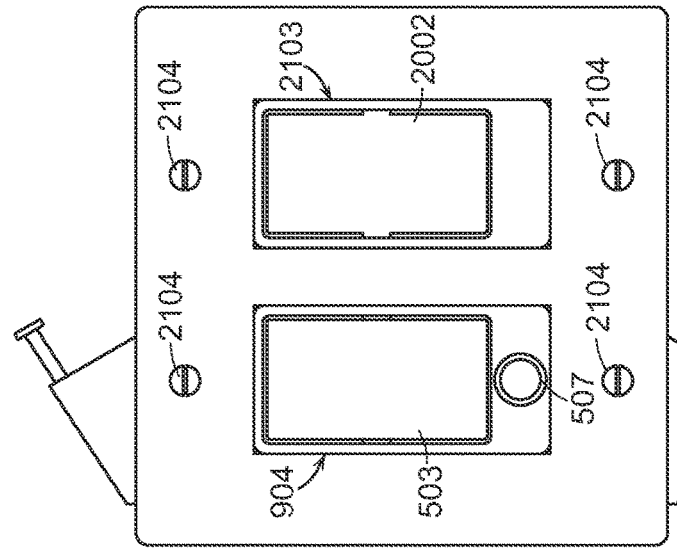
Figure 21A:
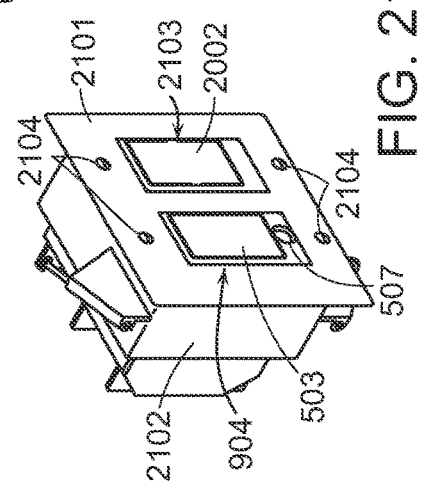

FIGS. 17 and 18 illustrate cross-sectional views of exemplary embodiments of the board stack 504. Each PCB 1101-1104 in the board stack 504, and the connections between the PCBs in the stack 504, are configured as described and illustrated above, such that a cavity 1701 is created within the board stack enclosure 601 where other components and/or PCBs may be added. In one exemplary embodiment, as illustrated in FIG. 17, speakers 413 and its related components reside within the cavity 1701. In another exemplary embodiment as illustrated in FIG. 18, a dimmer PCB 1801 is added to the board stack 504, where the dimmer PCB 1801 and its related components 1802 reside within the cavity 1701. Coupled to the dimmer PCB 1801 are wires 1803 that connect to the line voltage. In this example, the components of the IO PCB 1104 are combined with the dimmer components 1802 on the dimmer PCB 1801, and no separate IO PCB 1104 is needed. Given the relatively small dimensions of a single gang off-the-shelf wall switch box 903 within which the board stack 504 and board stack enclosure 601 reside, determining the configuration and orientation of each PCB in the board stack 504 such that additional PCB(s) and/or components also fit within the board stack enclosure 601 in their entirety is non-trivial.

FIGS. 19A and 19B illustrate a side view and a top view, respectively, of an exemplary embodiment of the connections between the PCBs of the board stack 504 with a dimmer PCB 1801. The connections include:

- The paddle PCB 1101 is coupled to the function PCB 1102 via a flexible printed circuit (FPC) cable 1901 coupled to both the connector 1302 on the paddle PCB 1101 (see also FIG. 13E) and the connector 1405 on the function PCB 1102 (see also FIG. 14D). As the paddle 503 (not shown) is pressed at the top and/or bottom, the paddle PCB 1101 moves with the paddle 503, engaging the top and/or bottom buttons 410A-410B on the function PCB 1102.
- The rear side (FIG. 14D) of the function PCB 1102 is physically and electrically coupled to the front side (FIG. 15B) of the MCU PCB 1103 via a connection between the pin mating connector 1502 on the primary MCU PCB 1103 (see also FIG. 15B) and the connector 1402 on the function PCB 1102 (see FIG. 14D).
- The connector 1404 on the function PCB 1102 is electrically coupled to the connector 1902 on the dimmer PCB 1801.
- The connector 1401 on the function PCB 1102 is electrically coupled to the connector 1603 on the combined IO/dimmer PCB 1801.

The connector 1602 on the combined IO/dimmer PCB 1801 is coupled to the IO module(s).

The connector 1302 on the paddle PCB 1101 is coupled to one end of the FPC cable 1901. The other end of the FPC cable 1901 is coupled to the connector 1405 on the function PCB 1102. The FPC cable 1901 traverses through an opening 1406 in the function PCB 1102 (see FIGS. 14B and 14D). The FPC cable 1901 is capable of flexing to allow for the movement of the paddle 503.

The connector 1502 on the MCU PCB is electrically coupled to the connector 1402 on the function PCB 1102 (see FIG. 14D).

In an alternative embodiment, the multi-function light switch 101 resides within an off-the-shelf two-gang wall switch box. FIGS. 20A-20D illustrate a front isometric view, a front view, a side view, and a rear view, respectively, of the switch 101 with a two-gang mounting yoke 2001. In this embodiment, the mounting yoke 2001 has two portions 2010 and 2020. The first portion 2010 has a first opening for a first user interface, such as the paddle 503. The second portion 2020 has a second opening for a second user interface 2002. The board stack 504 is coupled to the first portion 2010 and reside wholly within a first enclosure 601 at the first portion 2010, as described above. The first portion 2010 includes the PIR lens 507. The second portion 2020 includes components within a second enclosure 2008 which does not include a board stack 504. Instead, the component in the second portion 2020 is electrically coupled to the second user interface 2002, which is electrically coupled to the board stack 504 wholly residing in the first portion 2010. For example, the second user interface 2002 may be another paddle or a touch screen which is coupled to the board stack 504 via a cable connection to the connector 1603 on the IO PCB 1104. The board stack 504 may be implemented with additional functionalities which a user accesses through interaction with the second user interface 2002. The mounting holes 2004 on the second portion 2020 serves similar functions as the holes 509 in the first portion 2010. The holes 2005 on the second portion 2020 is used to couple a standard two-gang wall plate in a manner similar to the use of the holes 510 in the first portion 2010. The holes 2006 on the second portion 2020 couples the second portion 2020 of the yoke 2001 and a rear enclosure at the second portion 2020 (see FIGS. 21A-21D). The holes 2007 on the second portion 2020 are used to couple any add-on modules in a manner similar to the holes 604 on the first portion 2010. In this manner, additional functionality may be added to the switch 101 in an off-the-shelf two-gang wall switch box having exterior components familiar to users, which also reduces device clutter, complexity, user confusion, and expense.

FIGS. 21A-21D illustrate a front isometric view, a front view, a side view, and a rear view, respectively, of a two-gang wall switch box with a standard two-gang wall plate. The dimensions of a typical off-the-shelf two-gang wall switch box are approximately 4.5 inches width, 3 inches length, and 1.5 to 3.5 inches depth. Coupled to the front of the two-gang wall switch box 2102 is a two-gang wall plate 2101. The wall plate 2101 typically resides on the outside surface of the wall and is visible to the user. The wall plate 2101 includes a first opening 904 through which the first user interface 503 is accessible to a user and a second opening 2103 through which the second user interface 2002 is accessible to the user. The wall plate 2101 is coupled to the wall switch box 2102 through mounting screws 2104. The mounting yoke 2001 (FIG. 20A) is mounted to the wall switch box 2102 by a coupling mechanism traversing through the mounting holes 2004 of the mounting yoke 2001, where the board stack 504 resides wholly within the first portion 2010. Although a two-gang wall switch box is illustrated, additional gangs to add functionality to the switch 101 can be implemented in similar fashion.

Figure 22:
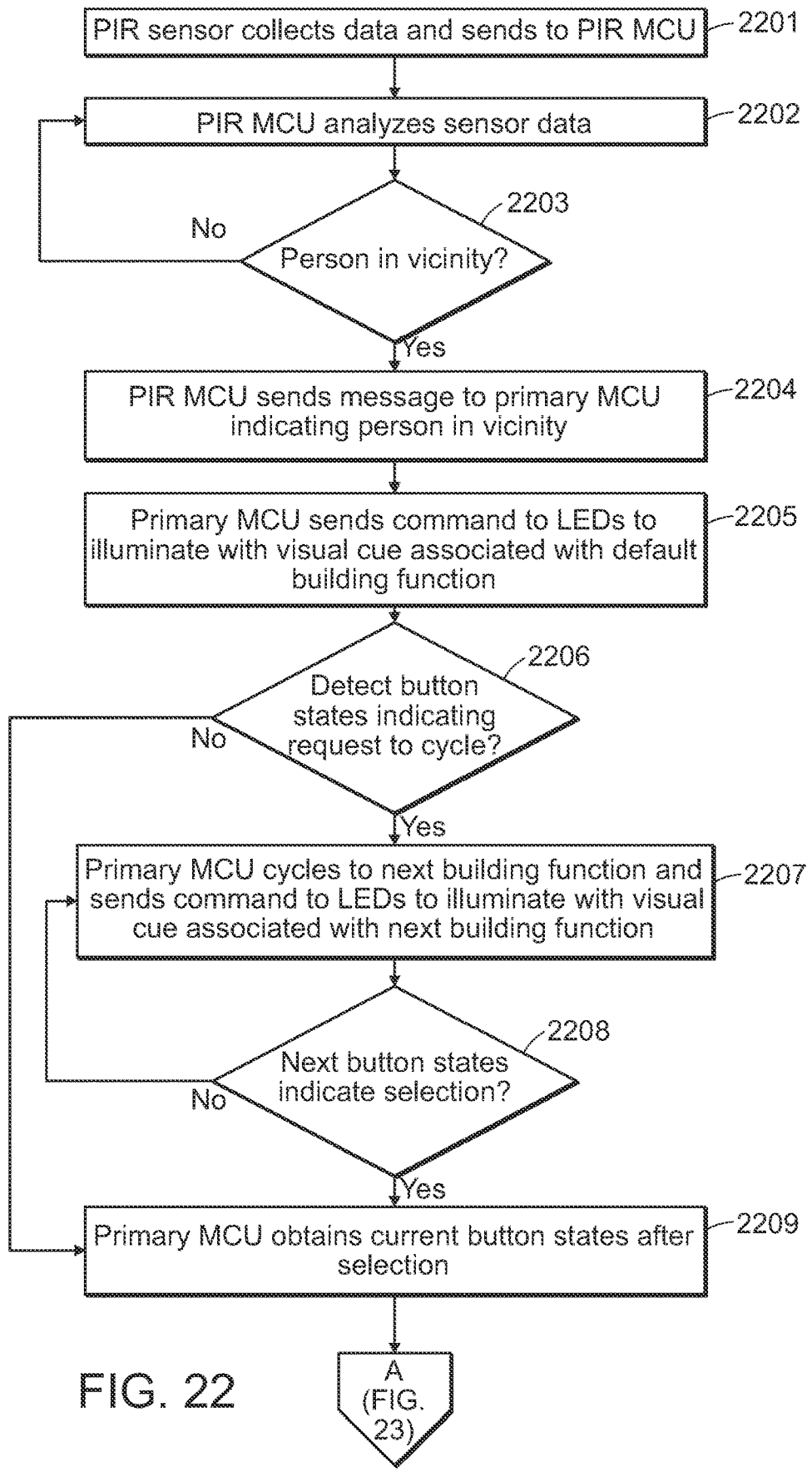
FIGS. 22-24 illustrates an exemplary embodiment of an algorithm executed by the multi-function light switch.
Figure 23:
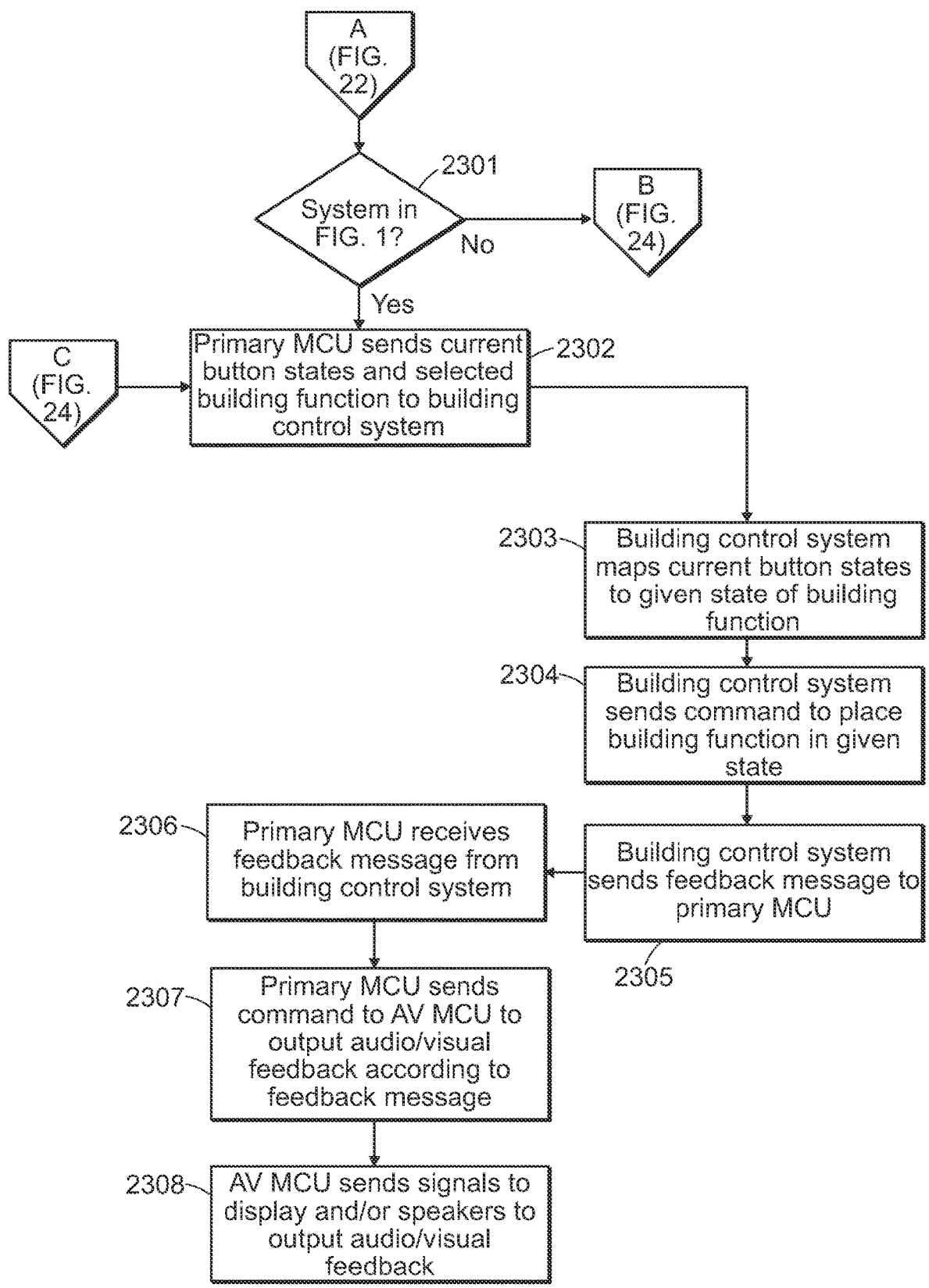
Figure 24:
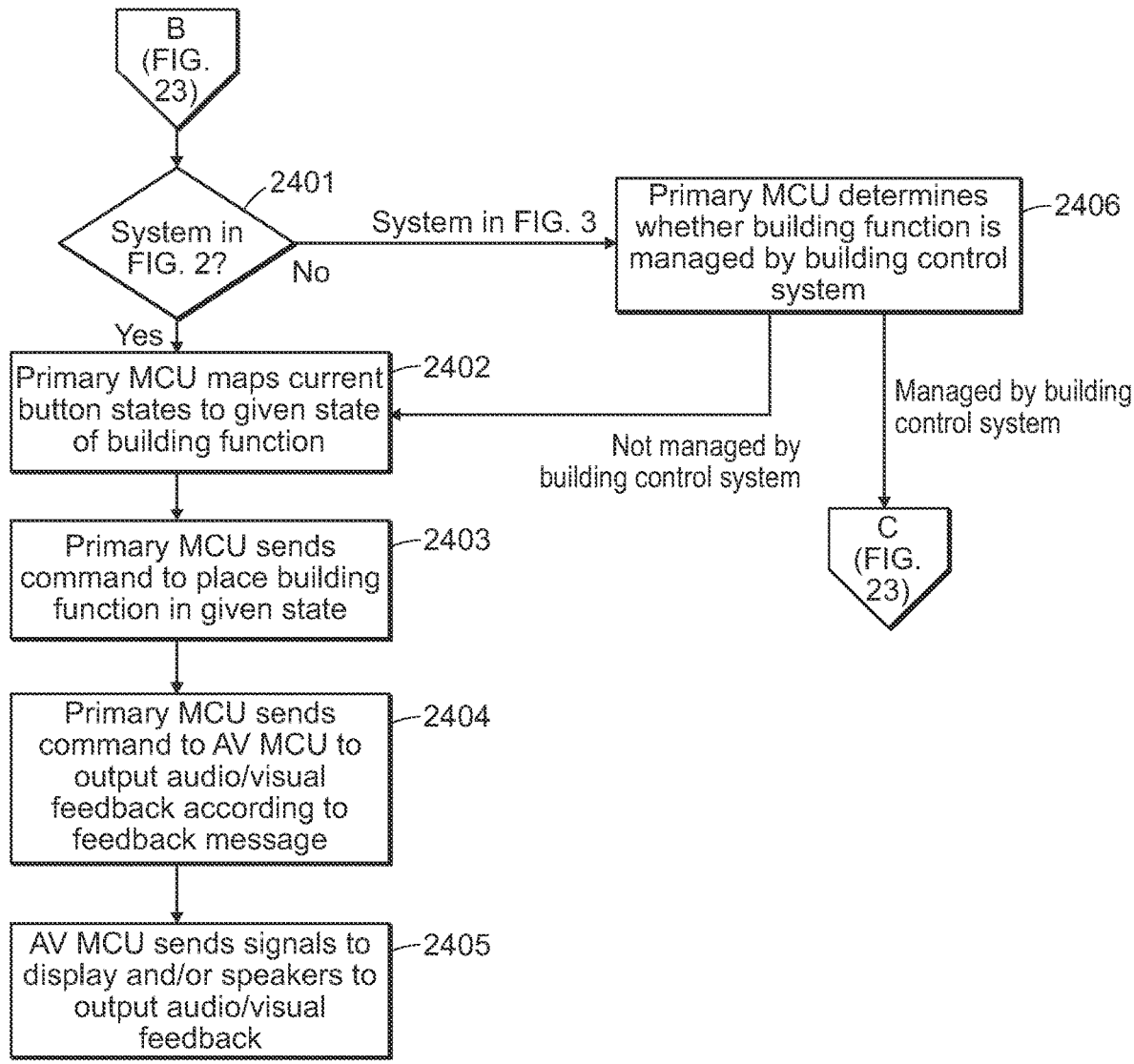

FIGS. 22-24 illustrate an exemplary embodiment of an algorithm executed by the multi-function light switch 101. Communications between components on different PCBs of the board stack 504 occur using the connections between the PCBs 1101-1104, as described above. The PIR sensors 411 collects data and sends the sensor data to the PIR MCU 404 (2201). The PIR MCU 404 analyzes the sensor data (2202) to determine whether the sensor data indicates that a person is in the vicinity of the switch 101 (2203). If a person is in the vicinity of the switch 101, then the PIR MCU 403 sends a message to the primary MCU 403 indicating that a person is in the vicinity of the switch 101 (2204). In response, the primary MCU 403 sends a command to the LEDs 409 to illuminate with a visual cue, such as a color, associated with a default building function (2205), such as to control a building's lighting 103. Optionally, the PIR sensors 411 may be omitted, the switch 101 can be active in the default building function without illumination. If the user wishes to control the default building function, then the user interfaces with a component on the exterior of the light switch assembly to control the default building function according to a predetermined set of gestures.

If the user wishes to use the switch 101 to control a building function other than the default building function, then the user engages the external component to indicate a request to cycle through the available switch functions (2206). For example, the user gesture of simultaneously pressing and holding both the first/top and second/bottom locations on a paddle for a preset amount of time, thus engaging both buttons 410A-410B at the same time, is an indication to cycle through the building functions. When such an indication is received, the primary MCU 403 cycles to the next building function and sends a command to the LEDs 409 to illuminate with a visual cue associated with the next building function (2207). The primary MCU 403 then determines whether the next button states detected indicates a selection of the building function (2208). For example, the user gesture of releasing both the top and bottom locations on the paddle, in turn causing both buttons 410A-410B to disengage, can be button states indicating a selection of the building function. If the next button states do not indicate a selection, then the primary MCU 403 cycles to the next building function and blocks 2207-2208 are repeated.

The set of available building functions are configurable per switch 101. Each building function is associated with a different visual cue. The association of building function and visual cue may be configurable per switch 101. Also configurable is the amount of time that the first and second buttons 410A-410B must be engaged to indicate a request to cycle through building functions. The order in which the building functions are cycled through may also be configurable per switch 101. Optionally, the switch 101 can output an audio indication via the speakers 413 each time a new function is cycled to. The audio indication may be a spoken-language enunciation of the building function. The audio indication may be configurable per switch 101. Thus, each switch 101 in a building may be individually configured to accommodate the unique needs at the switch location. The configuration for each switch 101 may be established by an end user and/or a technician. In one exemplary embodiment, a web or mobile application offers a plurality of sets of configuration settings to a technician or skilled end user. Optionally or in addition, the same or a different web or mobile application may offer a simpler, limited set of common configuration settings for an unskilled end user. When the configuration for a specific switch 101 is established via the web or mobile application, the configuration settings are downloaded to and stored at the corresponding switch 101, where the primary MCU 403 is able to access and implement the configuration settings. Any number or type of configuration settings may be offered. From example, the sets of configuration settings may include, but is not limited to, defining which lighting circuit or circuits a switch controls, assigning a user-friendly name to the switch, setting a ramp rate so that lights controlled by the switch 101 turn on or off incrementally over a short period of time as opposed to full-on or full-off immediately, and enabling a light switch to serve as a motion-activated night light.

Once the primary MCU 403 detects a selection of a building function (2208), the primary MCU 403 detects the current button states after the selection of the building function (2209). Referring to FIG. 23, with the system 10 illustrated in FIG. 1 (2301), the primary MCU 403 sends the current button states and the selected building function to the external building control system 102 (2302). In some embodiments, the building control system 102 uses a polling scheme to periodically query the switch 101. In other embodiments, the switch 101 asynchronously sends messages to the building control system 102 when particular events occur, such as a button press. The building control system 102 maps the current button states to a given state of the building function (2303). The building control system 102 sends a command to place the building function in the given state (2304). For example, when the building function is to turn on the light associated with the switch 101, the building control system 102 sends the command to the lighting system 103 to place the associated light in the on state.

For each building function, different user gestures are configured to be associated with different states specific to the building function. FIG. 25 illustrates a table of example associations between the building functions, the user gesture, and the state of the building function. For example, when the "set target temperature" function is selected, the user can push and hold the paddle at the top location to engage the first button 410A. This causes the target temperature to increase until the paddle is released and the first button 410A is disengaged. When the user pushes and holds the paddle at the bottom location to engage the second button 410A, the target temperature is decreased until the paddle is released and the second button 410B is disengaged. Other associations are possible. For example, when the control of a motorized window shade is selected, a user gesture of pushing the top location of the paddle to engage the first button 410A can be associated with raising the shade, pushing the bottom location of the paddle to engage the second button 410B can be associated with lowering the shade, pushing and holding the top location of the paddle to hold the engagement of the first button 410A can be associated with incrementally raising the shade, and pushing and holding the bottom location of the paddle to hold the engagement of the second button 410B can be associated with incrementally lowering the shade. Release of both the top and bottom locations of the paddle to disengage the first and second buttons 410A-410B can be associated with stopping movement of the shade. Optionally, audio and/or visual feedback may be associated with different building function states. For example, audio feedback in the form of the enunciation of the current temperature at every degree can be associated with the setting of the target temperature. Visual feedback in the form of illumination of the paddle with a specific color and displaying the current temperature and new target can be associated with the setting of the target temperature. The associations in FIG. 24 are illustrative only, and any number and type of associations can be configured.

Returning to FIG. 23, once the building control system 102 sends the command to place the building function into the given state (2304), the building control system 102 sends a feedback message to the primary MCU 403 (2305). The feedback message includes the audio and/or visual feedback associated with the given building function state. The audio and/or visual feedback can range from simple audio or visual feedback that the command triggered by the user's gesture has been completed. For example, the audio feedback can be a "beep" sound and/or an audible message such as "Done!." More elaborate or contextual feedback can also be configured. For example, if the switch is used to raise the target temperature in a heating/cooling zone to 72 degrees, the feedback message may be an audible message, such as "Temperature now set to 72 degrees". For another example, the visual feedback message may be include a graphic display of a thermometer or gauge depicting the temperature setting. The primary MCU 403 receives the feedback message from the building control system 102 (2306). In response, the primary MCU 403 sends a command to the AV MCU 405 to output the audio/visual feedback via the display 412 and/or speakers 413 according to the feedback message (2307). The AV MCU 405 sends signals to the display 412 and/or the speakers 413 to output the audio/visual feedback (2308). Optionally, preset or "canned" audio and/or visual data files may be stored on the switch 101 for ease of retrieval and use.

The selected building function remains active as long as the user continues to interact with the switch 101 via the paddle. If the user interactions cease for a preset period of time, then the primary MCU 403 resets the switch 101 to its default building function. The preset period of time for the ceasing of user interactions may be configured per switch 101.

Referring to FIG. 24, with the system 20 illustrated in FIG. 2 (2401), the building control system 102 is integrated into the switch 101, where the switch 101 is configured with the capabilities for direct control of building functions without the assistance of an external building control system. Once the current button states are obtained by the primary MCU 403 (2209, FIG. 22), the primary MCU 403 maps the current button states to a given state of the building function (2402) and sends the command to place the building function in the given state (2403), in a similar manner as described above. The primary MCU 403 sends a command to the AV MCU 405 to the output audio and/or visual feedback according to the feedback message (2404). The AV MCU 405 sends signals to the display 412 and/or the speakers 413 to output the audio/visual feedback (2405).

With the system 30 illustrated in FIG. 3, once the current button states are obtained by the primary MCU 403 (2209, FIG. 22), the primary MCU 403 determines whether the selected building function is managed by the switch 101 or the building control system 102 (2406). If the selected building function is managed by the building control system 102, then the algorithm continues at block 2302 (see FIG. 23). If the selected building function is managed by the switch 101, then the algorithm continues at block 2402.

Figure 26:
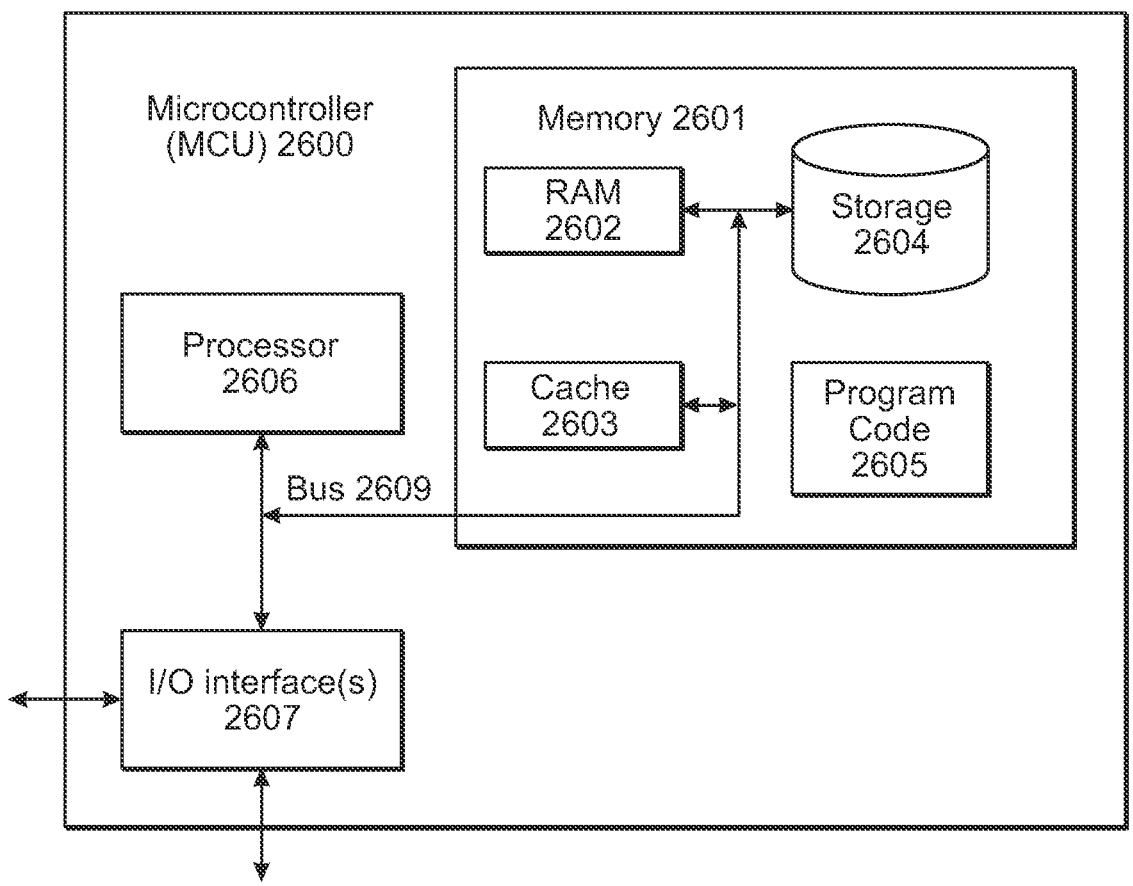
FIG. 26 illustrates a microcontroller unit (MCU) according to exemplary embodiments.

FIG. 26 illustrates a microcontroller unit (MCU) according to exemplary embodiments. The primary MCU 413, PIR MCU 404, and/or AV MCU 405 may be implemented using the MCU 2600. The MCU 2600 is operationally coupled to a processor or processing units 2606, a memory 2601, and a bus 2609 that couples various components, including the memory 2601 to the processor 2606. The bus 2609 represents one or more of any of several types of bus structure, including a memory bus or memory controller, a peripheral bus, an accelerated graphics port, and a processor or local bus using any of a variety of bus architectures. The memory 2601 may include computer readable media in the form of volatile memory, such as random access memory (RAM) 2602 or cache memory 2603, or non-volatile storage media 2604. The memory 2601 may include a set of at least one program code module 2605 that are configured to carry out the functions of embodiments of the present invention when executed by the processor 2606. The MCU 2600 may also communicate with other components via input/output (I/O) interfaces 2607.

All components of the device and their locations, electronic communication methods between the system components, magnet types, cables, wiring, attachment or securement mechanisms, mechanical connections, electrical connections, dimensions, values, materials, charging methods, battery types, applications/uses, tools and devices that can be used therewith, etc. discussed above or shown in the drawing, if any, are merely by way of example and are not considered limiting and other component(s) and their locations, electronic communication methods, magnet types, cables, wiring, attachment or securement mechanisms, mechanical connections, electrical connections, dimensions, values, materials, charging methods, battery types, applications/uses, tools and devices that can be used therewith, etc. can be chosen and used and all are considered within the scope of the disclosure.

The present invention can include a computer readable storage medium providing program code for use by or in connection with a computer or any instruction execution system. For the purposes of this description, a computer usable or computer readable storage medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, point devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified local function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the term "and/or" refers to any single item listed or any combination of two or more items listed. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims. The recitation of (a), (b), and the like in the appended claims are for the purpose of ease of reference and are not intended to convey an order of components, steps, or functions.

What is claimed is:
1. A multi-function light switch, comprising:
 a board stack, comprising:
  a user interface printed circuit board (PCB) comprising a front side and a rear side, the user interface PCB comprising a user interface;
  a function PCB comprising a front side and a rear side, the front side coupled to the rear side of the user interface PCB, the function PCB comprising:
   a plurality of buttons at the front side of the function PCB for engaging the user interface;

an audio/visual (AV) microcontroller unit (MCU) configured to communicate with one or more audio/visual components; and
a first connector and a second connector on the rear side of the function PCB;
a MCU PCB comprising a front side and a rear side, the MCU PCB comprising:
a third connector physically and electrically coupled to the first connector on the function PCB; and
a primary MCU on the rear side of the MCU PCB configured to communicate with the function PCB via the third connector and the first connector to control a set of building functions according to states of the plurality of buttons; and
an input/output (IO) PCB comprising a front side and a rear side, the IO PCB comprising:
a function pass through connector on the front side of the IO PCB electrically coupled to the second connector on the function PCB; and
a pin header on the rear side of the IO PCB electrically coupled to an IO module configured to send and receive power and data between the board stack and one or more components external to the board stack,
wherein the user interface PCB, the function PCB, the MCU PCB, and the IO PCB in the board stack are configured to entirely reside within a single light switch wall switch box.

2. The switch of claim 1, wherein when the board stack resides in the single wall switch box, the board stack forms a cavity within the single wall switch box.

3. The switch of claim 2, wherein one or more AV components reside within the cavity.

4. The switch of claim 2, wherein an additional PCB resides within the cavity.

5. The switch of claim 1, wherein the board stack is configured to couple to a single wall switch box mounting yoke comprising dimensions as set forth in "ANSI/NEMA WD 6-2016: Wiring Devices-Dimensional Specifications" ("Standard"), approved by the American National Standard (ANSI) and published by the National Electrical Manufacturers Association.

6. The switch of claim 1, wherein the primary PCB is configured to:
detect button states for the plurality of buttons indicating a request to cycle through a set of building functions;
in response to detecting the button states indicating a request to cycle through the set of building functions, cycle to a next building function;
obtain next button states and determine whether the next button states indicate a selection of the next building function;
when the next button states do not indicate the selection of the next building function: repeat the cycling to the next building function and repeat the obtaining of the next button states and determining whether the next button states indicate the selection of the next building function;
when the next button states indicate the selection of the next building function, obtain the current button states after the selection; and
when the selected building function is managed by the primary MCU, map the current button states to a given state of the selected building function and send a command to place the selected building function in the given state.

7. The switch of claim 6, further comprising a display and one or more speakers,
wherein the primary MCU is further configured to send a command to the AV MCU to output one or more audio/visual feedbacks associated with the selected building function and the given state,
wherein the AV MCU is configured to send one or more signals to the display or the one or more speakers to output the audio/visual feedback.

8. The switch of claim 6, further comprising a display, and one or more speakers,
wherein when the selected building function is managed by an external building control system, the primary MCU is further configured to:
send the current button states to the external building control system;
receive a feedback message from the external building control system comprising one or more audio/visual feedbacks associated with the selected building function and the given state; and
send a command to the AV MCU to output the one or more audio/visual feedbacks,
wherein the AV MCU is configured to send one or more signals to a display or at least one speaker to output the audio/visual feedback.

9. The switch of claim 6, wherein the function PCB further comprises one or more sensors and a passive infrared microcontroller unit (PIR MCU), wherein the PIR MCU is configured to:
receive sensor data from the one or more sensors;
analyze the sensor data to determine whether a person is in the vicinity of the switch;
when the person is in the vicinity of the switch, send a message to the primary MCU indicating that the person is in the vicinity.

10. The switch of claim 1, wherein the user interface comprises a paddle with a first location and a second location, wherein pressing the paddle at the first location engages a first button of the plurality of buttons and pressing the paddle at the second location engages a second button of the plurality of buttons.

* * * * *